(12) United States Patent
Matsumoto et al.

(10) Patent No.: US 12,163,632 B2
(45) Date of Patent: Dec. 10, 2024

(54) LIGHT EMITTING DEVICE, LIGHT FIXTURE, AND STREET LIGHT

(71) Applicant: NICHIA CORPORATION, Anan (JP)

(72) Inventors: Mika Matsumoto, Anan (JP); Kazushige Fujio, Tokushima (JP)

(73) Assignee: NICHIA CORPORATION, Anan (JP)

( * ) Notice: Subject to any disclaimer, the term of this patent is extended or adjusted under 35 U.S.C. 154(b) by 429 days.

(21) Appl. No.: 17/660,784

(22) Filed: Apr. 26, 2022

(65) Prior Publication Data

US 2022/0349533 A1    Nov. 3, 2022

(30) Foreign Application Priority Data

Apr. 26, 2021 (JP) ................................ 2021-074392

(51) Int. Cl.
| | |
|---|---|
| *F21K 9/64* | (2016.01) |
| *C09K 11/77* | (2006.01) |
| *F21W 131/103* | (2006.01) |
| *F21Y 115/10* | (2016.01) |

(52) U.S. Cl.
CPC .......... *F21K 9/64* (2016.08); *C09K 11/77348* (2021.01); *C09K 11/7774* (2013.01); *F21W 2131/103* (2013.01); *F21Y 2115/10* (2016.08)

(58) Field of Classification Search
CPC .......... C09K 11/77348; C09K 11/7774; F21K 9/64
USPC ....................................................... 313/483
See application file for complete search history.

(56) References Cited

U.S. PATENT DOCUMENTS

| | | |
|---|---|---|
| 7,927,512 B2 | 4/2011 | Murazaki et al. |
| 8,274,208 B2 | 9/2012 | Miyake et al. |
| 8,530,250 B2 | 9/2013 | Ichikawa et al. |
| 9,287,476 B2 | 3/2016 | Ichikawa et al. |
| 9,490,411 B2 | 11/2016 | Ichikawa et al. |
| 9,537,071 B2 | 1/2017 | Ichikawa et al. |
| 9,735,323 B2 | 8/2017 | Asai et al. |
| 10,115,870 B2 | 10/2018 | Ichikawa et al. |

(Continued)

FOREIGN PATENT DOCUMENTS

| | | |
|---|---|---|
| CN | 111916547 A | 11/2020 |
| JP | 2005093913 A | 4/2005 |

(Continued)

OTHER PUBLICATIONS

"Kobayashi, S., et al., Study on the Effect of Headlight Source Spectrum on Discomfort Glare, No. 5-10, pp. 9-14, 6 pages."

*Primary Examiner* — Christopher M Raabe
(74) *Attorney, Agent, or Firm* — Hunton Andrews Kurth LLP

(57) ABSTRACT

A light emitting device comprises a light emitting element having a light emission peak wavelength in a range of 400 nm or more and 490 nm or less and a first fluorescent material having a light emission peak wavelength in a range of 570 nm or more and 680 nm or less, and emits light having a correlated color temperature being 1,950 K or less, an average color rendering index Ra being 70 or more, a full width at half maximum of a light emission peak having the maximum light emission intensity being 110 nm or less, and a ratio B/L of an effective radiance B to a luminance L being 0.151 or less, wherein the luminance of light emitted by the light emitting device in a range of 300 nm or more and 800 nm or less when B and L is as defined in the disclosure.

20 Claims, 15 Drawing Sheets

(56) References Cited

U.S. PATENT DOCUMENTS

| | | | |
|---|---|---|---|
| 10,573,788 B2 | 2/2020 | Ichikawa et al. | |
| 10,573,789 B2 | 2/2020 | Ichikawa et al. | |
| 10,700,241 B2 | 6/2020 | Ichikawa et al. | |
| 11,094,854 B2 | 8/2021 | Ichikawa et al. | |
| 2010/0208481 A1 | 8/2010 | Miyake et al. | |
| 2010/0219746 A1 | 9/2010 | Murazaki et al. | |
| 2011/0210354 A1 | 9/2011 | Ichikawa et al. | |
| 2013/0082289 A1 | 4/2013 | Sakuta et al. | |
| 2014/0084320 A1 | 3/2014 | Ichikawa et al. | |
| 2016/0049566 A1 | 2/2016 | Ichikawa et al. | |
| 2016/0056357 A1 | 2/2016 | Ichikawa et al. | |
| 2016/0315286 A1* | 10/2016 | Kuroki | H10K 50/854 |
| 2017/0005239 A1 | 1/2017 | Asai et al. | |
| 2017/0141273 A1 | 5/2017 | Ichikawa et al. | |
| 2018/0301600 A1 | 10/2018 | Ichikawa et al. | |
| 2019/0035981 A1 | 1/2019 | Ichikawa et al. | |
| 2019/0088825 A1 | 3/2019 | Ichikawa et al. | |
| 2020/0287096 A1 | 9/2020 | Ichikawa et al. | |
| 2021/0336094 A1 | 10/2021 | Ichikawa et al. | |
| 2024/0234648 A1* | 7/2024 | Hino | F21S 41/176 |

FOREIGN PATENT DOCUMENTS

| | | |
|---|---|---|
| JP | 2008050379 A | 3/2008 |
| JP | 2009096883 A | 5/2009 |
| JP | 2010062272 A | 3/2010 |
| JP | 2013012778 A | 1/2013 |
| JP | 2015038826 A | 2/2015 |
| JP | 2017017317 A | 1/2017 |
| JP | 2019009429 A | 1/2019 |
| JP | 2020057756 A | 4/2020 |
| WO | 2007015542 A1 | 2/2007 |
| WO | 2014084379 A1 | 6/2014 |
| WO | 2021025120 A1 | 2/2021 |

* cited by examiner

LIGHT EMITTING DEVICE, LIGHT FIXTURE, AND STREET LIGHT

CROSS-REFERENCE TO RELATED PATENT APPLICATION

This application claims priority to Japanese Patent Application No. 2021-074392, filed on Apr. 26, 2021, the disclosure of which is hereby incorporated reference in its entirety.

BACKGROUND

Technical Field

The present disclosure relates to a light emitting device, a light fixture, and a street light.

Description of Related Art

Light sources for outdoor light fixtures such as street lights and road illumination lights often use HID lamps such as high-pressure mercury lamps, metal halide lamps, and high-pressure sodium lamps, since they have a longer life and higher efficiency than incandescent lamps. Light sources using these lamps use mercury as a light emitting material, and with the regulation of the Minamata Convention on Mercury, there is a demand for replacement with light fixtures using safe light emitting materials.

For example, Japanese Unexamined Patent Publication No. 2015-038826 discloses a street light that is equipped with a light source unit including a plurality of LED light sources and a substantially box-shaped reflection unit having reflection surfaces, and irradiates a road with both light from the light source and reflected light obtained by reflecting the light from the light source on the reflection surfaces.

Light emitted from light fixtures used outdoors may be required to be suppressed from scattering. Examples of the light fixtures used outsides include light fixtures that are expected to be used outdoors, such as headlights that can be worn on the human head, flashlights, and portable lanterns using LEDs, in addition to the street lights and road illumination lights installed outdoors. It may also be desired to suppress scattering in light fixtures even in the case of indoors when these are expected to be used near entrances, near windows, and other places close to the outdoors.

Accordingly, aspects of the present disclosure are to provide a light emitting device, a light fixture, and a street light capable of emitting light with more suppressed scattering.

SUMMARY

A first aspect of the present disclosure relates to a light emitting device including a light emitting element having a light emission peak wavelength in a range of 400 nm or more and 490 nm or less and a first fluorescent material having a light emission peak wavelength in a range of 570 nm or more and 680 nm or less, wherein the light emitting device emits light having a correlated color temperature being 1,950 K or less, an average color rendering index Ra being 70 or more, a full width at half maximum of a light emission peak having a maximum light emission intensity in a light emission spectrum of the light emitting device being 110 nm or less, and a first scattering index B/L of an effective radiance B to a luminance L, as defined by the following formula (1), being 0.151 or less, wherein L is the luminance of light emitted by the light emitting device in a range of 300 nm or more and 800 nm or less in consideration of a photopic standard specific luminous sensitivity curve of humans specified by CIE (Commission Internationale de l'Eclairage), and B is the effective radiance of light emitted by the light emitting device in a range of 300 nm or more and 800 nm or less in consideration of a scattering intensity curve for wavelengths when the scattering intensity of Rayleigh scattering at a wavelength of 300 nm is 1:

$$B/L = \frac{\int_{300}^{800} Dc(\lambda) \times S(\lambda) d\lambda}{\int_{300}^{800} S(\lambda) \times V(\lambda) d\lambda} \quad (1)$$

wherein $S(\lambda)$ represents a spectral radiance of light emitted by the light emitting device, $V(\lambda)$ represents a photopic standard specific luminous sensitivity curve of humans specified by CIE (Commission Internationale de l'Eclairage), and $Dc(\lambda)$ represents a scattering intensity curve for wavelengths when the scattering intensity of Rayleigh scattering at a wavelength of 300 nm is 1 in Rayleigh scattering.

A second aspect of the present disclosure relates to a light emitting device including a light emitting element having a light emission peak wavelength in a range of 400 nm or more and 490 nm or less and a first fluorescent material having a light emission peak wavelength in a range of 570 nm or more and 680 nm or less, wherein the light emitting device emits light having a correlated color temperature being 1,950 K or less, an average color rendering index Ra being 70 or more, a full width at half maximum of a light emission peak having a maximum light emission intensity in a light emission spectrum of the light emitting device being 110 nm or less, and a second scattering index B/A of an effective radiance B to a radiance A, as defined by the following formula (2), being 0.060 or less, wherein A is the radiance of light emitted by the light emitting device in a range of 300 nm or more and 800 nm or less, and B is the effective radiance of light emitted by the light emitting device in a range of 300 nm or more and 800 nm or less in consideration of a scattering intensity curve for wavelengths when the scattering intensity of Rayleigh scattering at a wavelength of 300 nm is 1:

$$B/A = \frac{\int_{300}^{800} Dc(\lambda) \times S(\lambda) d\lambda}{\int_{300}^{800} S(\lambda) d\lambda} \quad (2)$$

wherein $S(\lambda)$ represents a spectral radiance of light emitted by the light emitting device and $Dc(\lambda)$ represents a scattering intensity curve for wavelengths when the scattering intensity of Rayleigh scattering at a wavelength of 300 nm is 1 in Rayleigh scattering.

A third aspect of the present disclosure relates to a light fixture including the light emitting device.

A fourth aspect of the present disclosure relates to a street light including the light emitting device.

In accordance with the aspects of the present disclosure, a light emitting device, a light fixture, and a street light capable of emitting light with more suppressed scattering, can be provided.

DETAILED DESCRIPTION

Figure 1:
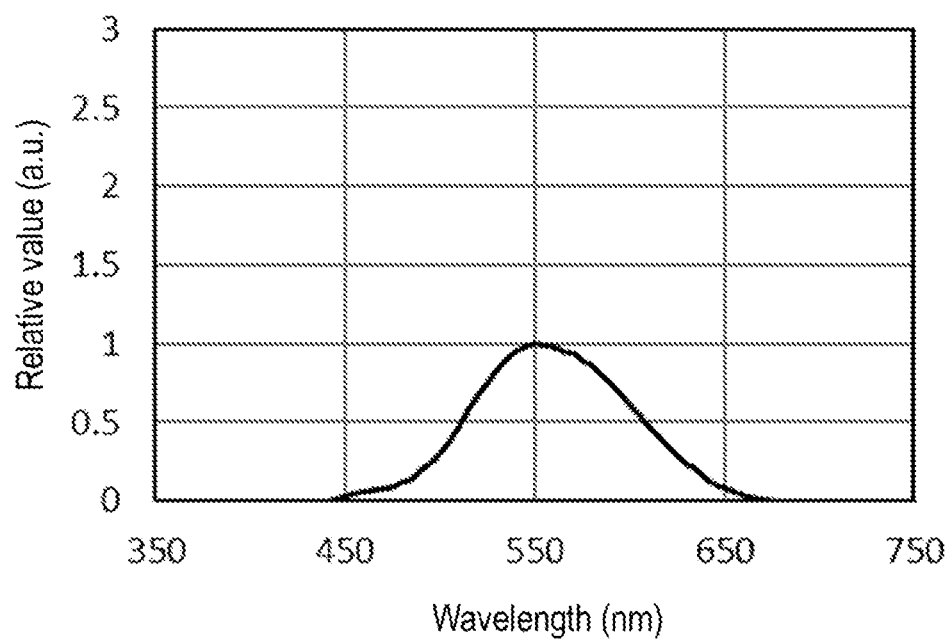
FIG. 1 is a photopic standard specific luminous sensitivity curve V(λ) of humans, which is specified by CIE, disclosed in Non-Patent Literature 2.

The embodiments of the present disclosure are hereunder described by reference to the accompanying drawings. The embodiments described below are exemplifications for embodying the technical idea of the present disclosure, and the present disclosure is not limited to the light emitting device, the light fixture, and the street light described below. In addition, the members described in the claims are by no means limited to members of the embodiments. Especially, unless otherwise specified, any dimensions, materials, shapes, and relative arrangements of the structural members described in the embodiments are not intended to limit the scope of the present disclosure only but are merely explanatory examples. The relationships between color names and chromaticity coordinates, and the relationships between wavelength ranges of light and color names of monochromic light are in accordance with Japanese Industrial Standard JIS Z8110. In the present specification, unless otherwise specified, in the case where plural substances corresponding to each component are present in the composition, the content of each component in the composition means a total amount of plural substances present in the composition. The full width at half maximum means a wavelength width of the light emission peak showing a value of 50% of the maximum light emission intensity in the light emission spectrum. In this specification, the "fluorescent material" is used in the same meaning as a "fluorescent phosphor".

The light emitting device according to the first embodiment is a light emitting device including a light emitting element having a light emission peak wavelength in a range of 400 nm or more and 490 nm or less and a first fluorescent material having a light emission peak wavelength in a range of 570 nm or more and 680 nm or less, wherein the light emitting device emits light having a correlated color temperature being 1,950 K or less, an average color rendering index Ra being 70 or more, a full width at half maximum of a light emission peak having the maximum light emission intensity in a light emission spectrum of the light emitting device being 110 nm or less, and a first scattering index B/L of an effective radiance B to a luminance L, as defined by the following formula (1), being 0.151 or less, wherein the luminance of light emitted by the light emitting device in a range of 300 nm or more and 800 nm or less in consideration of photopic standard specific luminous sensitivity of humans specified by CIE (Commission Internationale de l'Eclairage) is referred to as L, and the effective radiance of light emitted by the light emitting device in a range of 300 nm or more and 800 nm or less in consideration of a scattering intensity curve for wavelengths when the scattering intensity of Rayleigh scattering at a wavelength of 300 nm is 1 is referred to as B:

$$B/L = \frac{\int_{300}^{800} Dc(\lambda) \times S(\lambda) d\lambda}{\int_{300}^{800} S(\lambda) \times V(\lambda) d\lambda} \quad (1)$$

wherein S(λ) represents a spectral radiance of light emitted by the light emitting device, V(λ) represents a photopic standard specific luminous sensitivity curve of humans specified by CIE (Commission Internationale de l'Eclairage), and Dc(λ) represents a scattering intensity curve for wavelengths when the scattering intensity of Rayleigh scattering at a wavelength of 300 nm is 1 in Rayleigh scattering.

Scattering of light caused by the interaction of light and fine particles is determined by the relative relationship between the wavelength λ of light and the size D of fine particles. The size D of the fine particles contained in the air is much smaller than the wavelength λ of light. Rayleigh scattering is the scattering of light caused by particles that are smaller in size than the wavelength of the light. In the air, the shorter the wavelength of light, the more easily the light is scattered. Suppression of light scattering allows light to reach a long distance. Light emitting devices capable of allowing light to reach a long distance can illuminate a relatively distant frontal area, for example, about 100 m, and can be suitably used for light fixtures used outdoors or indoors but in places close to the outdoors.

The luminance L of light emitted by the light emitting device is derived by the following formula (3). The luminance L of light emitted by the light emitting device is an integrated value of the spectral radiance S(λ) of the light emitting device in a range of 300 nm or more and 800 nm or less and the photopic standard specific luminous sensitivity curve V(λ) of humans specified by CIE.

$$L = \int_{300}^{800} S(\lambda) \times V(\lambda) d\lambda \qquad (3)$$

Non-Patent Literature 2 discloses a photopic standard specific luminous sensitivity curve V(λ) of humans used in the side optical system of the CIE 1931 color system (Non-Patent Literature 2: "Research on the Effect of Spectral Distribution of Headlamp Light Source on Discomfort Glare" by Shouji Kobayashi, et al., Preprint of Academic Lecture Meeting of Society of Automotive Engineers of Japan, No. 5 to 10, pp. 9-14). FIG. 1 shows a photopic standard specific luminous sensitivity curve V(λ) of humans, which is specified by CIE, disclosed in Non-Patent Literature 2. The relative value shown in FIG. 1 is a value when the peak top of the photopic standard specific luminous sensitivity curve V(λ) of humans specified by CIE is set to 1.

Figure 2:
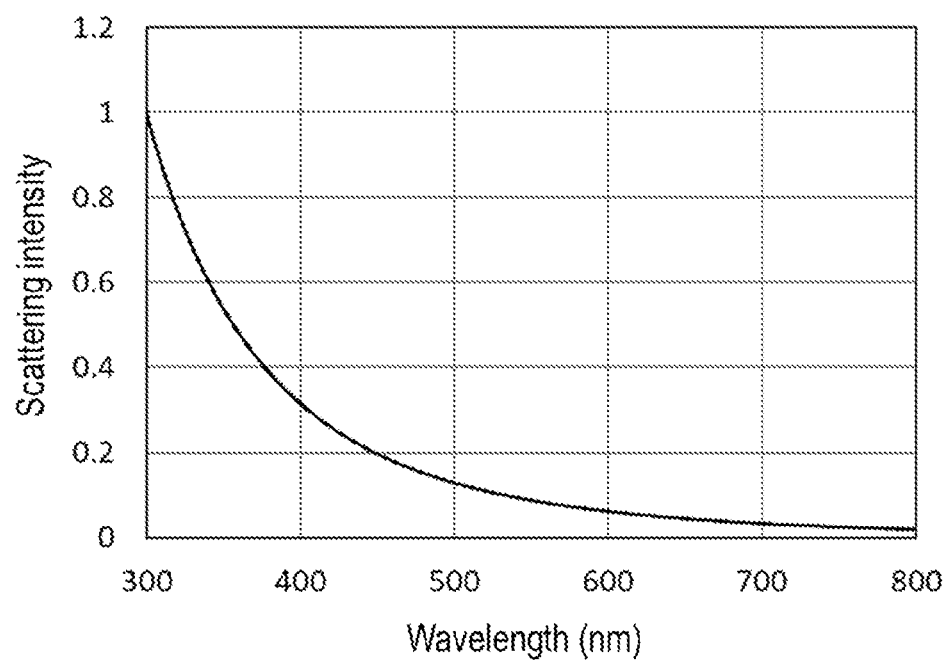
FIG. 2 is a graph showing an intensity curve Dc(λ) of Rayleigh scattering with a scattering intensity of 1 at a wavelength of 300 nm.

FIG. 2 shows a scattering intensity curve Dc(λ) for wavelengths when the scattering intensity of Rayleigh scattering at a wavelength of 300 nm is 1.

The effective radiance B of light emitted by the light emitting device is derived by the following formula (4). The effective radiance B of light emitted by the light emitting device is an integral value of the scattering intensity curve Dc(λ) and the spectral radiance S(λ) of the light emitting device in a range of 300 nm or more and 800 nm or less.

$$B = \int_{300}^{800} Dc(\lambda) \times S(\lambda) d\lambda \qquad (4)$$

The first scattering index B/L of light emitted by the light emitting device is a ratio of the effective radiance B of light emitted by the light emitting device in a range of 300 nm or more and 800 nm or less in consideration of a scattering intensity curve for wavelengths when the scattering intensity of Rayleigh scattering at a wavelength of 300 nm is 1, to the luminance L of light emitted by the light emitting device in a range of 300 nm or more and 800 nm or less. The first scattering index B/L represents the degree of scattering of light emitted by the light emitting device in consideration of the photopic standard specific luminous sensitivity of humans.

When the first scattering index B/L of light emitted by the light emitting device is 0.151 or less, the light emitting device emits light with suppressed scattering in consideration of the photopic standard specific luminous sensitivity of humans. When the first scattering index B/L of light emitted by the light emitting device is more than 0.151, the scattering is not suppressed and it becomes difficult for the light to reach a long distance. The first scattering index B/L of light emitted by the light emitting device is preferably 0.150 or less, and more preferably 0.149 or less. Considering Rayleigh scattering, the first scattering index B/L of light emitted by the light emitting device may be 0.01 or more, may be 0.02 or more, may be 0.05 or more, may be 0.10 or more, and may be 0.12 or more.

The light emitting device according to the second embodiment is a light emitting device including a light emitting element having a light emission peak wavelength in a range of 400 nm or more and 490 nm or less and a first fluorescent material having a light emission peak wavelength in a range of 570 nm or more and 680 nm or less, wherein the light emitting device emits light having a correlated color temperature being 1,950 K or less, an average color rendering index Ra being 70 or more, a full width at half maximum of a light emission peak having the maximum light emission intensity in a light emission spectrum of the light emitting device being 110 nm or less, and a second scattering index B/A of an effective radiance B to a radiance A, as defined by the following formula (2), being 0.060 or less, wherein the radiance of light emitted by the light emitting device in a range of 300 nm or more and 800 nm or less is referred to as A, and the effective radiance of light emitted by the light emitting device in a range of 300 nm or more and 800 nm or less in consideration of a scattering intensity curve for wavelengths when the scattering intensity of Rayleigh scattering at a wavelength of 300 nm is 1 is referred to as B:

$$B/A = \frac{\int_{300}^{800} Dc(\lambda) \times S(\lambda) d\lambda}{\int_{300}^{800} S(\lambda) d\lambda} \qquad (2)$$

wherein S(λ) represents a spectral radiance of light emitted by the light emitting device and Dc(λ) represents a scattering intensity curve for wavelengths when the scattering intensity of Rayleigh scattering at a wavelength of 300 nm is 1 in Rayleigh scattering.

The radiance A of light emitted by the light emitting device is derived by the following formula (5). S(λ) in the formula (5) represents a spectral radiance of light emitted by the light emitting device.

$$A = \int_{300}^{800} S(\lambda) d\lambda \qquad (5)$$

The second scattering index B/A of light emitted by the light emitting device is a ratio of the effective radiance B of light emitted by the light emitting device in a range of 300 nm or more and 800 nm or less in consideration of a scattering intensity curve for wavelengths when the scattering intensity of Rayleigh scattering at a wavelength of 300 nm is 1, to the radiance A of light emitted by the light emitting device in a range of 300 nm or more and 800 nm or less. The second scattering index B/A represents the degree of scattering of light emitted by the light emitting device without considering the photopic standard specific luminous sensitivity of humans.

When the second scattering index B/A of light emitted by the light emitting device is 0.060 or less, the light emitting device emits light with suppressed scattering even when the photopic standard specific luminous sensitivity of humans is not taken into consideration. When the second scattering index B/A of light emitted by the light emitting device is more than 0.060, the scattering is not suppressed and it becomes difficult for the light to reach a long distance. The second scattering index B/A of light emitted by the light emitting device is preferably 0.059 or less, and more preferably 0.058 or less. Considering Rayleigh scattering, the second scattering index B/A of light emitted by the light emitting device may be 0.010 or more, may be 0.020 or more, and may be 0.030 or more.

High-pressure sodium lamps used as light sources for outdoor light fixtures such as street lights and road illumination lamps have a correlated color temperature of approximately 2,000 to 2,500 K according to catalog values, and emit light having a large amount of yellow to orange components. As the light sources for light fixtures used outdoors, light sources such as HID lamps, halogen lamps, and light emitting devices using LEDs are used depending on the characteristics such as luminous flux and energy.

The light emitting device emits light having a correlated color temperature of 1,950 K or less. The light emitting device emits light having a correlated color temperature comparable to or slightly lower than that emitted by, for example, high-pressure sodium lamps. When the correlated color temperature of light emitted by the light emitting device is 1,950 K or less, the light emitting device emits light that does not cause discomfort to humans even when it is substituted for a light source for light fixtures used outdoors such as street lights and road illumination lamps using high-pressure sodium lamps as their light source. The correlated color temperature of light emitted by the light emitting device may be 1,920 K or less, and may be 1,900 K or less. To ensure that light emitted by, for example, light fixtures installed outdoors does not cause discomfort to humans, the correlated color temperature of light emitted by the light emitting device is preferably 1,000 K or more, may be 1,200 K or more, may be 1,500 K or more, and may be 1,700 K or more.

The average color rendering index Ra of light emitted by the light emitting device may be 70 or more, may be 75 or more, may be 80 or more, may be 85 or more, and may be 90 or more. The average color rendering index Ra of light emitted by the light emitting device can be measured in accordance with JIS Z8726. The closer the value of the average color rendering index Ra of light emitted by the light emitting device to 100, the closer the color rendering property is to the reference light source. The color rendering property represents the degree of appearance of irradiated objects. When the average color rendering index Ra of light emitted by the light emitting device is 70 or more, light having sufficient color rendering properties can be emitted even in factories where general work is performed, offices, and schools. The average color rendering index Ra of the light emitting device may be 99 or less.

The special color rendering index R9 of light emitted by the light emitting device is an index for evaluating red color. The light emitting device used in light fixtures installed outdoors such as street lights and road illumination lamps, or indoors but in places close to the outdoors, the light emitting device has a low necessity of confirming red in many cases. The special color rendering index R9 of light emitted by the light emitting device may be a negative value. The special color rendering index R9 of light emitted by the light emitting device may be in a range of minus (−) 150 or more and plus (+) 99 or less, may be in a range of −140 or more and +98 or less, and may be in a range of −135 or more and 95 or less.

In the light emitting device, the full width at half maximum of the light emission peak having the maximum light emission intensity in the light emission spectrum of the light emitting device is 110 nm or less, may be 100 nm or less, may be 95 nm or less, and may be 90 nm or less; and may be 3 nm or more, may be 40 nm or more, may be 60 nm or more, and may be 70 nm or more. When the full width at half maximum of the light emission peak having the maximum light emission intensity in the light emission spectrum of the light emitting device is wide, there is a tendency that the component of light on the long wavelength side, which is difficult for humans to perceive, increases, or the component of light on the short wavelength side, which is easily scattered by fine particles in the air, increases. When the component of light on the long wavelength side increases, there is a tendency that the luminance of light emitted by the light emitting device decreases. When the component of light on the short wavelength side increases, it tends to be difficult for light to reach a long distance. Meanwhile, when the full width at half maximum of the light emission peak having the maximum light emission intensity in the light emission spectrum of the light emitting device is narrow, there is a tendency that the component of light in a specific wavelength range increases. When the light emission peak having the maximum light emission intensity is on the short wavelength side in the light emission spectrum of the light emitting device, the light emission on the short wavelength side, which is easily affected by fine particles in the air and easily scattered, is not suppressed, and it becomes difficult to suppress scattering. In the light emission spectrum of the light emitting device, when the light emission peak having the maximum light emission intensity is on the long wavelength side and the component of light on the long wavelength side, which is difficult for humans to perceive, increases, it becomes difficult to suppress the decrease in luminance. To provide a light emitting device capable of emitting light with suppressed scattering, the full width at half maximum of the light emission peak having the maximum light emission intensity in the light emission spectrum of the light emitting device is preferably 110 nm or less.

The full width at half maximum of the light emission peak having the maximum light emission intensity in the light emission spectrum of the light emitting device may be narrower than that of the light emission peak having the light emission peak wavelength of a first fluorescent material or that of the light emission peak having the light emission peak wavelength of a second fluorescent material included in the light emitting device. For example, when the light emitting device includes a first fluorescent material and a second fluorescent material having light emission peak wavelengths in different wavelength ranges, the light emission intensity changes in the region where the light emission spectrum of the first fluorescent material overlaps with that of the second fluorescent material. As a result, the light emission spectrum of the mixed color light emitted by the light emitting device is different from the light emission spectrum of the first fluorescent material or the light emission spectrum of the second fluorescent material, and the full width at half maximum thereof may be narrower than that of the light emission peak having the light emission peak wavelength of the first fluorescent material or that of the light emission peak having the light emission peak wavelength of the second fluorescent material.

The light emission peak wavelength having the maximum light emission intensity in the light emission spectrum of the light emitting device is preferably in a range of 570 nm or more and 680 nm or less, may be in a range of 575 nm or more and 680 nm or less, and may be in a range of 575 nm or more and 670 nm or less. The range of the light emission peak wavelength having the maximum light emission intensity in the light emission spectrum of the light emitting device may overlap with the range of the light emission peak wavelength of the first fluorescent material. The light emission peak having the maximum light emission intensity in the light emission spectrum of the light emitting device may be derived from the light emission of the first fluorescent material.

Light Emitting Element

The light emitting element has a light emission peak wavelength in a range of 400 nm or more and 490 nm or less. The light emission peak wavelength of the light emitting element is preferably in a range of 420 nm or more and 480 nm or less, and may be in a range of 440 nm or more and 460 nm or less. With this configuration, the light emitting device emits light having a correlated color temperature that does not cause discomfort when illuminating outdoors, satisfying the color rendering property required for light to illuminate outdoors, and suppressing scattering. At least a part of the light emitted by the light emitting element is used as excitation light for a first fluorescent material, and when the light emitting device includes a second fluorescent material, it is used as excitation light for the second fluorescent material. Apart of the light emitted by the light emitting element is also used as light emitted from the light emitting device. The full width at half maximum of the light emission peak having the light emission peak wavelength in the light emission spectrum of the light emitting element is preferably 30 nm or less, more preferably 25 nm or less, and even more preferably 20 nm or less. The light emitting element preferably uses, for example, a semiconductor light emitting element using a nitride-based semiconductor. With this configuration, a stable light emitting device having high efficiency, high linearity of output to input, and high resistance to mechanical impact, can be obtained.

First Fluorescent Material

The light emitting device includes a first fluorescent material having a light emission peak wavelength in a range of 570 nm or more and 680 nm or less. The first fluorescent material is excited by light emitted by the light emitting element having a light emission peak wavelength in a range of 400 nm or more and 490 nm or less, and emits light having a light emission peak wavelength in a range of 570 nm or more and 680 nm or less. The first fluorescent material may have a light emission peak wavelength in a range of 575 nm or more and 670 nm or less, and may have a light emission peak wavelength in a range of 580 nm or more and 660 nm or less. The first fluorescent material preferably has a full width at half maximum of the light emission peak having the light emission peak wavelength in the light emission spectrum of the first fluorescent material in a range of 3 nm or more and 120 nm or less. The full width at half maximum of the light emission peak having the light emission peak wavelength in the light emission spectrum of the first fluorescent material is preferably in a range of 3 nm or more and 15 nm or less, or in a range of 60 nm or more and 120 nm or less. In order for the light emitting device to emit light having a correlated color temperature that does not cause discomfort in, for example, light fixtures used outdoors, satisfying the color rendering property required for light fixtures used outdoors, and suppressing scattering, the full width at half maximum of the light emission peak having the light emission peak wavelength in the light emission spectrum of the first fluorescent material is preferably in the above-mentioned range.

The first fluorescent material preferably contains at least one selected from the group consisting of a first nitride fluorescent material having a composition represented by the following formula (1A), a second nitride fluorescent material having a composition represented by the following formula (1B), a fluoride fluorescent material having a composition represented by the following formula (1C), and a fluoride fluorescent material having a composition represented by the following formula (1C') that is different from that of the following formula (1C). By including the first fluorescent material, the light emitting device emits light with suppressed scattering where the correlated color temperature is 1,950 K or less, the average color rendering index Ra is 70 or more, the full width at half maximum of the light emission peak having the maximum light emission intensity in the light emission spectrum of the light emitting device is 110 nm or less, and the first scattering index B/L is 0.151 or less. Also, by including the first fluorescent material, the light emitting device emits light with suppressed scattering where the second scattering index B/A is 0.060 or less.

$$M^1{}_2Si_5N_8:Eu \quad (1A)$$

wherein $M^1$ represents an alkaline earth metal element containing at least one selected from the group consisting of Ca, Sr, and Ba.

$$Sr_1Ca_sAl_tSi_uN_v:Eu \quad (1B)$$

wherein q, s, t, u, and v each satisfy $0 \le q < 1$, $0 < s \le 1$, $q+s \le 1$, $0.9 \le t \le 1.1$, $0.9 \le u \le 1.1$, and $2.5 \le v \le 3.5$.

$$A_c[M^2{}_{1-b}Mn^{4+}{}_bF_d] \quad (1C)$$

wherein A includes at least one selected from the group consisting of $K^+$, $Li^+$, $Na^+$, $Rb^+$, $Cs^+$, and $NH_4^+$, of which $K^+$ is preferred; $M^2$ includes at least one element selected from the group consisting of Group 4 elements and Group 14 elements, of which Si and Ge are preferred; b satisfies $0 < b < 0.2$; c represents the absolute value of the charge of $[M^2{}_{1-b}Mn^{4+}{}_bF_d]$ ions; and d satisfies $5 < d < 7$.

$$A'_{c'}[M^{2'}{}_{1-b}Mn^{4+}{}_bF_{d'}] \quad (1C')$$

wherein A' includes at least one selected from the group consisting of $K^+$, $Li^+$, $Na^+$, $Rb^+$, $Cs^+$, and $NH_4^+$, of which $K^+$ is preferred; $M^{2'}$ includes at least one element selected from the group consisting of Group 4 elements, Group 13 elements, and Group 14 elements, of which Si and Al are preferred; b' satisfies $0 < b' < 0.2$; c' represents the absolute value of the charge of $[M^{2'}{}_{1-b}Mn^{4+}{}_bF_{d'}]$ ions; and d' satisfies $5 < d' < 7$.

In the present specification, in the formula representing the composition of the fluorescent material, the part before the colon (:) represents a host crystal and the molar ratio of each element in 1 mol of the composition of the fluorescent material, and the part after the colon (:) represents an activating element.

The first fluorescent material may contain at least one fluorescent material selected from the group consisting of a fluorogermanate fluorescent material, a fourth nitride fluorescent material, and a first sulfide fluorescent material. The fluorogermanate fluorescent material has, for example, a composition represented by the following formula (1D). The fourth nitride fluorescent material has, for example, a composition represented by the following formula (1E). The first sulfide fluorescent material has, for example, a composition represented by the following formula (1F).

$$(i-j)MgO \cdot (j/2)Sc_2O_3 \cdot kMgF_2 \cdot mCaF_2 \cdot (1-n)GeO_2 \cdot (n/2)M^3{}_2O_3:Mn \quad (1D)$$

wherein $M^3$ represents at least one selected from the group consisting of Al, Ga, and In; and i, j, k, m, and n each satisfy $2 \le i \le 4$, $0 \le j < 0.5$, $0 < k < 1.5$, $0 \le m < 1.5$, and $0 \le n < 0.5$.

$$M^4{}_{v2}M^5{}_{w2}Al_{3-y2}Si_{y2}N_{z2}:M^6 \quad (1E)$$

wherein $M^4$ represents at least one element selected from the group consisting of Ca, Sr, Ba, and Mg; $M^5$ represents at least one element selected from the group consisting of Li, Na, and K; $M^6$ represents at least one element selected from the group consisting of Eu, Ce, Tb, and Mn; and v2, w2, y2, and z2 each satisfy 0.80≤v2≤1.05, 0.80≤w2≤1.05, 0≤y2≤0.5, and 3.0≤z2≤5.0.

$$(Ca,Sr)S:Eu \quad (1F)$$

In the present specification, plural elements sectioned by comma (,) in the formula representing the composition of a fluorescent material mean that at least one of these plural elements is contained in the composition, and a combination of two or more of these plural elements may be contained.

The fluorogermanate fluorescent material having a composition represented by the formula (1D) may have a composition represented by the following formula (1d).

$$3.5MgO \cdot 0.5MgF_2 \cdot GeO_2:Mn \quad (1d)$$

The fourth nitride fluorescent material having a composition represented by the formula (1E) may have a composition represented by the following formula (1e).

$$M^4_{v2}M^5_{w2}M^6_{x2}Al_{3-y2}Si_{y2}N_{z2} \quad (1e)$$

wherein $M^4$, $M^5$, and $M^6$ are synonymous with those of the formula (1E), respectively; v2, w2, y2, and z2 are synonymous with those of the formula (1E), respectively; and x2 satisfies 0.001<x2≤0.1.

The fluorogermanate fluorescent material, the fourth nitride fluorescent material, and the first sulfide fluorescent material have a light emission peak wavelength in a range of 570 nm or more and 680 nm or less, and preferably in a range of 600 nm or more and 630 nm or less. The fluorogermanate fluorescent material, the fourth nitride fluorescent material, and the first sulfide fluorescent material have a full width at half maximum of the light emission peak having the light emission peak wavelength in the light emission spectrum of the first fluorescent material in a range of, for example, 5 nm or more and 100 nm or less, and preferably in a range of 6 nm or more and 90 nm or less.

The light emitting device of the first embodiment and the light emitting device of the second embodiment may include at least one type of first fluorescent material alone, and may include two or more types of first fluorescent materials. By including the first fluorescent material, the light emitting device emits light with suppressed scattering where the correlated color temperature is 1,950 K or less, which does not cause discomfort when used outdoors or indoors but in places close to the outdoors, the average color rendering index Ra is 70 or more, the full width at half maximum of the light emission peak having the maximum light emission intensity in the light emission spectrum of the light emitting device is 110 nm or less, and the first scattering index B/L is 0.151 or less. Also, by including the first fluorescent material, the light emitting device emits light with suppressed scattering where the correlated color temperature is 1,950 K or less, the average color rendering index Ra is 70 or more, the full width at half maximum of the light emission peak having the maximum light emission intensity in the light emission spectrum of the light emitting device is 110 nm or less, and the second scattering index B/A is 0.060 or less.

In the light emitting device of the first embodiment and the light emitting device of the second embodiment, the first fluorescent material may contain at least one selected from the group consisting of a fluorogermanate fluorescent material having a composition represented by the formula (1D), a fourth nitride fluorescent material having a composition represented by the formula (1E), and a first sulfide fluorescent material having a composition represented by the formula (1F). The first fluorescent material may contain at least one type of fluorescent material alone, and may contain two or more types of fluorescent materials.

The content of the first fluorescent material included in the light emitting device varies depending on the form of the light emitting device and other factors. When the first fluorescent material is included in a wavelength conversion member of the light emitting device, the wavelength conversion member preferably contains a fluorescent material and a translucent material. The wavelength conversion member may include a wavelength conversion body containing a fluorescent material and a translucent material. The total amount of the fluorescent material contained in the wavelength conversion member may be in a range of 10 parts by mass or more and 900 parts by mass or less, may be in a range of 15 parts by mass or more and 850 parts by mass or less, and may be in a range of 20 parts by mass or more and 800 parts by mass or less, relative to 100 parts by mass of the translucent material. When the light emitting device includes only a first fluorescent material and no other fluorescent materials other than the first fluorescent material, the total amount of the fluorescent material refers to the total amount of the first fluorescent material. When the light emitting device includes a first fluorescent material and a second fluorescent material, the total amount of the fluorescent material refers to the total amount of the first fluorescent material and the second fluorescent material.

When the light emitting device includes a second fluorescent material described later, the content of the first fluorescent material included in the light emitting device is preferably in a range of 5% by mass or more and 95% by mass or less relative to the total amount of the first fluorescent material and the second fluorescent material. When the content of the first fluorescent material included in the light emitting device falls within the range of 5% by mass or more and 95% by mass or less relative to the total amount of the first fluorescent material and the second fluorescent material, the light emitting device emits light with suppressed scattering where the correlated color temperature is 1,950 K or less, the average color rendering index Ra is 70 or more, the full width at half maximum of the light emission peak having the maximum light emission intensity in the light emission spectrum of the light emitting device is 110 nm or less, and the first scattering index B/L is 0.151 or less. When the content of the first fluorescent material included in the light emitting device falls within the range of 5% by mass or more and 95% by mass or less relative to the total amount of the first fluorescent material and the second fluorescent material, the light emitting device emits light with suppressed scattering where the correlated color temperature is 1,950 K or less, the average color rendering index Ra is 70 or more, the full width at half maximum of the light emission peak having the maximum light emission intensity in the light emission spectrum of the light emitting device is 110 nm or less, and the second scattering index B/A is 0.060 or less. The content of the first fluorescent material included in the light emitting device may be in a range of 8% by mass or more and 80% by mass or less, may be in a range of 10% by mass or more and 70% by mass or less, and may be in a range of 11% by mass or more and 60% by mass or less, relative to the total amount of the first fluorescent material and the second fluorescent material.

Second Fluorescent Material

The light emitting device preferably includes a second fluorescent material having a light emission peak wavelength in a range of 480 nm or more and less than 570 nm. The second fluorescent material is excited by light emitted by the light emitting element having a light emission peak wavelength in a range of 400 nm or more and 490 nm or less, and emits light having a light emission peak wavelength in a range of 480 nm or more and less than 570 nm. The second fluorescent material excited by the light emitting element may have a light emission peak wavelength in a range of 490 nm or more and 565 nm or less, and may have a light emission peak wavelength in a range of 495 nm or more and 560 nm or less. In the second fluorescent material, the full width at half maximum of the light emission peak having the light emission peak wavelength in the light emission spectrum of the second fluorescent material is preferably in a range of 20 nm or more and 125 nm or less, may be in a range of 25 nm or more and 124 nm or less, and may be in a range of 30 nm or more and 123 nm or less. In order for the light emitting device to emit light having a correlated color temperature that does not cause discomfort in, for example, light emitting devices used outdoors or indoors but in places close to the outdoors, having sufficient color rendering properties even in factories where general work is performed, offices, and schools, and suppressing scattering, the full width at half maximum of the light emission peak having the light emission peak wavelength in the light emission spectrum of the second fluorescent material is preferably in the above-mentioned range.

The second fluorescent material preferably contains at least one selected from the group consisting of a rare earth aluminate fluorescent material having a composition represented by the following formula (2A) and a third nitride fluorescent material having a composition represented by the following formula (2B).

$$Ln^1{}_3(Al_{1-a}Ga_a)_5O_{12}:Ce \tag{2A}$$

wherein $Ln^1$ includes at least one element selected from the group consisting of Y, Gd, Tb, and Lu; and a satisfies $0 \le a \le 0.5$.

$$La_wLn^2{}_xSi_6N_y:Ce_z \tag{2B}$$

wherein $Ln^2$ includes at least one selected from the group consisting of Y and Gd as an essential component, and may include at least one selected from the group consisting of Sc and Lu; the total of Y and Gd contained in $Ln^2$ is 90 mol % or more when the $Ln^2$ elements contained in 1 mol of the composition is 100 mol %; and w, x, y, and z each satisfy $1.2 \le w \le 2.2$, $0.5 \le x \le 1.2$, $10 \le y \le 12.0$, $0.5 \le z \le 1.2$, $1.80 < w+x < 2.40$, and $2.9 \le w+x+z \le 3.1$.

In the rare earth aluminate fluorescent material having a composition represented by the formula (2A) and the third nitride fluorescent material having a composition represented by the formula (2B), the full width at half maximum of the light emission peak having the light emission peak wavelength in the light emission spectrum of the fluorescent material is, for example, 90 nm or more, preferably 100 nm or more, and more preferably 110 nm or more; and, for example, 125 nm or less, preferably 124 nm or less, and more preferably 123 nm or less.

The second fluorescent material may contain at least one type of fluorescent material selected from the group consisting of an alkaline earth metal aluminate fluorescent material and an alkaline earth metal halosilicate fluorescent material. The alkaline earth metal aluminate fluorescent material is, for example, a fluorescent material containing at least strontium and activated with europium, and has a composition represented by, for example, the following formula (2C). The alkaline earth metal halosilicate fluorescent material is, for example, a fluorescent material containing at least calcium and chlorine and activated with europium, and has a composition represented by, for example, the following formula (2D).

$$Sr_4Al_{14}O_{25}:Eu \tag{2C}$$

$$(Ca,Sr,Ba)_8MgSi_4O_{16}(F,Cl,Br)_2:Eu \tag{2D}$$

In the formula (2C), a part of Sr may be substituted with at least one element selected from the group consisting of Mg, Ca, Ba, and Zn.

The alkaline earth metal aluminate fluorescent material having a composition represented by the formula (2C) and the alkaline earth metal halosilicate fluorescent material having a composition represented by the formula (2D) have a light emission peak wavelength in a range of 480 nm or more and less than 520 nm, and preferably in a range of 485 nm or more and 515 nm or less.

In the alkaline earth metal aluminate fluorescent material having a composition represented by the formula (2C) and the alkaline earth metal halosilicate fluorescent material having a composition represented by the formula (2D), the full width at half maximum of the light emission peak having the light emission peak wavelength in the light emission spectrum of the fluorescent material is, for example, 30 nm or more, preferably 40 nm or more, and more preferably 50 nm or more; and, for example, 80 nm or less, and preferably 70 nm or less.

The second fluorescent material may contain at least one type of fluorescent material selected from the group consisting of a β-SiAlON fluorescent material, a second sulfide fluorescent material, a scandium-based fluorescent material, and an alkaline earth metal silicate-based fluorescent material. The β-SiAlON fluorescent material has, for example, a composition represented by the following formula (2E). The second sulfide fluorescent material has, for example, a composition represented by the following formula (2F). The scandium-based fluorescent material has, for example, a composition represented by the following formula (2G). The alkaline earth metal silicate-based fluorescent material has, for example, a composition represented by the following formula (2H) or a composition represented by the following formula (2J).

$$Si_{6-g}Al_gO_gN_{8-g}:Eu \ (0<g \le 4.2) \tag{2E}$$

$$(Sr,M^7)Ga_2S_4:Eu \tag{2F}$$

wherein $M^7$ represents at least one element selected from the group consisting of Be, Mg, Ca, Ba, and Zn.

$$(Ca,Sr)Sc_2O_4:Ce \tag{2G}$$

$$(Ca,Sr)_3(Sc,Mg)_2Si_3O_{12}:Ce \tag{2H}$$

$$(Ca,Sr,Ba)_2SiO_4:Eu \tag{2J}$$

The β-SiAlON fluorescent material, the second sulfide fluorescent material, the scandium-based fluorescent material, and the alkaline earth metal silicate-based fluorescent material have a light emission peak wavelength in a range of 520 nm or more and less than 580 nm, and preferably in a range of 525 nm or more and 565 nm or less. In the β-SiAlON fluorescent material, the second sulfide fluorescent material, the scandium-based fluorescent material, and the alkaline earth metal silicate-based fluorescent material, the full width at half maximum of the light emission peak having the light emission peak wavelength in the light emission spectrum of the second fluorescent material is, for example, 20 nm or more, and preferably 30 nm or more; and, for example, 120 nm or less, and preferably 115 nm or less.

The second fluorescent material may contain at least one type of fluorescent material selected from the group consisting of a rare earth aluminate fluorescent material having a composition represented by the formula (2A), a third nitride fluorescent material having a composition represented by the formula (2B), an alkaline earth metal aluminate fluorescent material having a composition represented by the formula (2C), an alkaline earth metal halosilicate fluorescent material having a composition represented by the formula (2D), a β-SiAlON fluorescent material having a composition represented by the formula (2E), a second sulfide fluorescent material having a composition represented by the formula (2F), a scandium-based fluorescent material having a composition represented by the formula (2G), an alkaline earth metal silicate-based fluorescent material having a composition represented by the formula (2H), and an alkaline earth metal silicate-based fluorescent material having a composition represented by the formula (2J). The second fluorescent material may contain at least one type of the fluorescent material alone, and may include two or more types of these.

The light emitting device preferably emits light having a color deviation Duv, which is a deviation from a black body radiation locus, in a range of minus (−) 0.008 or more and plus (+) 0.008 or less. The color deviation Duv is a deviation from the black body radiation locus of light emitted from the light emitting device, and is measured according to JIS Z8725. Even in the case of a relatively low correlated color temperature of 1,950 K or less, when the color deviation Duv from the black body radiation locus (Duv: 0.000) on the CIE 1931 chromaticity diagram falls within the range of −0.008 or more and +0.008 or less, the color of irradiated objects is natural, and light that does not cause discomfort is emitted from the light emitting device. The light emitting device emits light having a color deviation Duv, which is a deviation from the black body radiation locus at 1,950 K or less, preferably in a range of −0.008 or more and +0.008 or less, more preferably in a range of −0.006 or more and +0.006 or less, and even more preferably in a range of −0.003 or more and +0.003 or less. When emitting light having a color deviation Duv, which is a deviation from the black body radiation locus at 1,950 K or less, of less than −0.008 or more than +0.008, the color of irradiated objects deviates from the natural color, which may cause discomfort to humans.

Figure 3A:
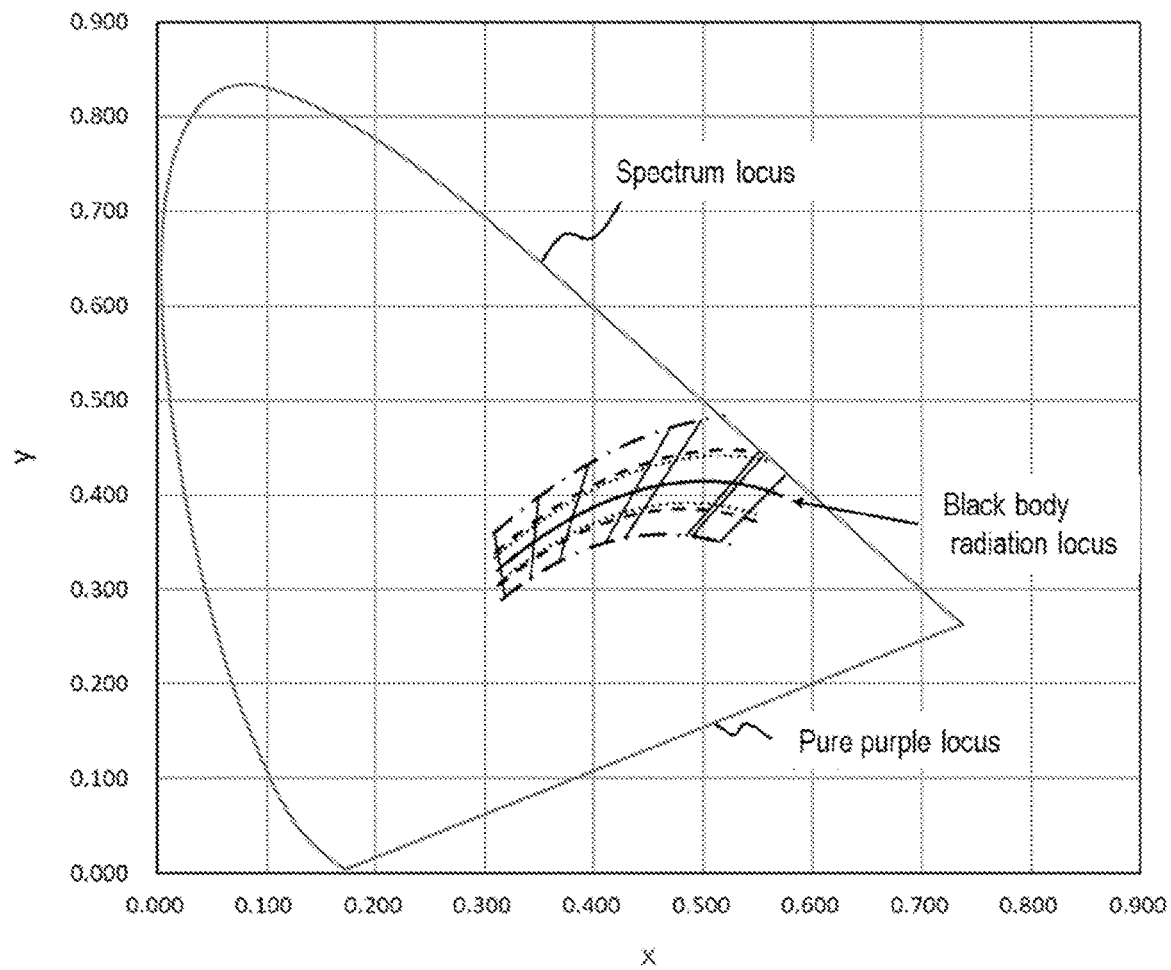
FIG. 3A is a CIE 1931 chromaticity diagram showing a black body radiation locus (Duv: 0.000) within the spectral locus and pure purple locus on the CIE 1931 chromaticity diagram, and color deviations from the black body radiation locus.
Figure 3B:
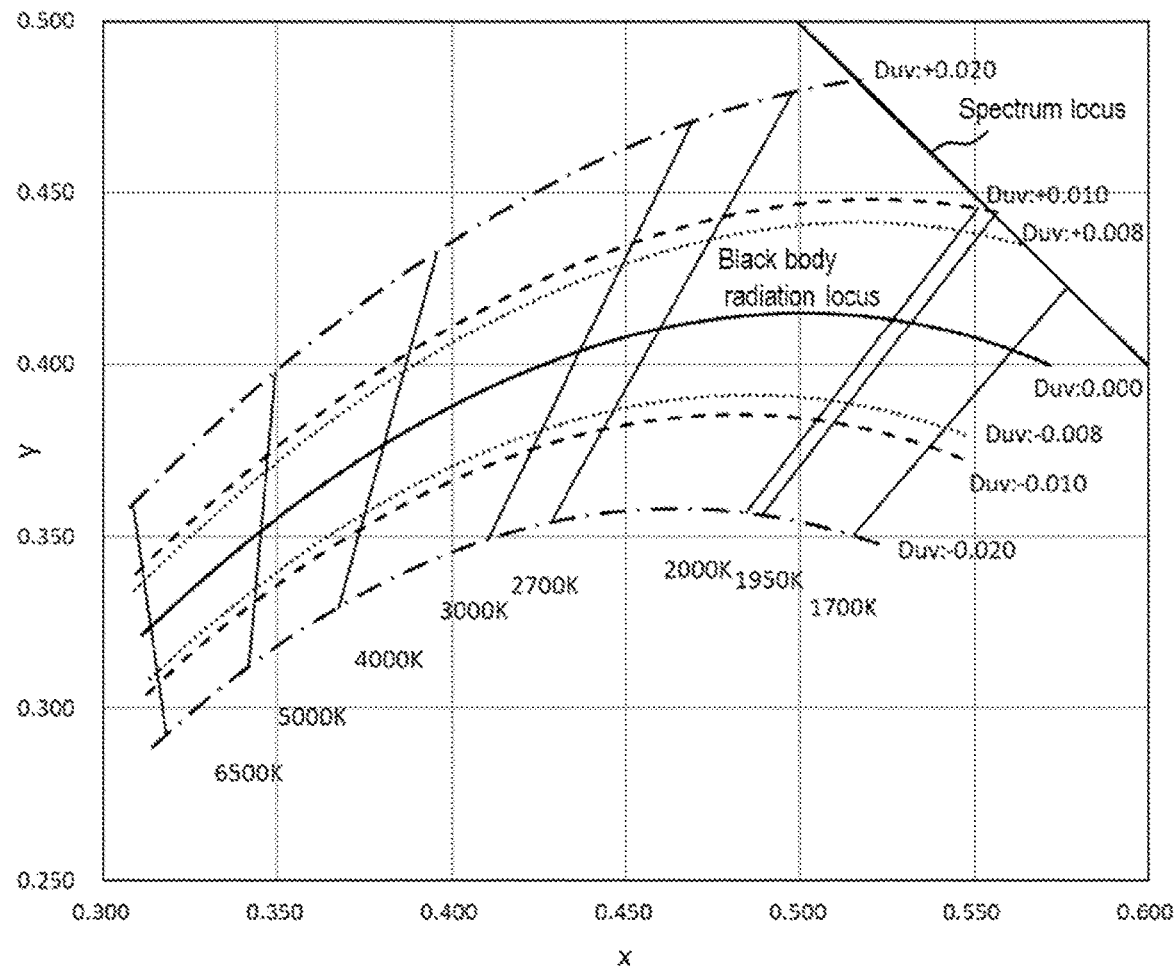
FIG. 3B is a partially enlarged view of FIG. 3A, showing a black body radiation locus (Duv: 0.000) in the CIE 1931 chromaticity diagram in which the x-value of the chromaticity coordinates is in a range of 0.300 or more and 0.600 or less and the y-value is in a range of 0.250 or more and 0.500 or less, and each locus of color deviations (Duv: −0.020, −0.010, −0.008, +0.008, +0.010, and +0.020) from the black body radiation locus in each correlated color temperature.

FIG. 3A is a diagram showing a black body radiation locus (Duv: 0.000) within the spectral locus and pure purple locus on the CIE 1931 chromaticity diagram, and color deviations from the black body radiation locus. FIG. 3B is a partially enlarged view of FIG. 3A, showing a black body radiation locus in the CIE 1931 chromaticity diagram in which the x-value of the chromaticity coordinates is in a range of 0.300 or more and 0.600 or less and the y-value is in a range of 0.250 or more and 0.500 or less, and each locus of color deviations from the black body radiation locus with Duv of −0.020, Duv of −0.010, Duv of −0.008, Duv of +0.008, Duv of +0.010, and Duv of +0.020 from the black body radiation locus. In FIG. 3B, the straight lines intersecting the black body radiation locus (Duv: 0.000) each are an isotemperature line at each correlated color temperature (CCT of 1,700 K, 1,950 K, 2,000 K, 2,700 K, 3,000 K, 4,000 K, 5,000 K, and 6,500K), respectively. In the case where the color deviation Duv of the mixed light emitted from the light emitting device is 0, the locus thereof has no deviation from the black body radiation locus and approximates the black body radiation locus.

The light emitting device preferably emits light having a second radiance in a range of 650 nm or more and 750 nm or less being 50% or less relative to 100% of a first radiance in a range of 400 nm or more and 750 nm or less. In the light emission of the light emitting device, the ratio of the second radiance in the range of 650 nm or more and 750 nm or less to 100% of the first radiance in the range of 400 nm or more and 750 nm or less is also referred to as Lp. When the ratio Lp of the second radiance to the first radiance in the light emission of the light emitting device is 50% or less, the light with suppressed scattering where the red component is relatively small among the mixed color light emitted from the light emitting device, is emitted from the light emitting device without reducing the luminance and without causing discomfort to humans. The ratio Lp of the second radiance to the first radiance in the light emission of the light emitting device may be 45% or less, may be 40% or less, may be 35% or less, and may be 30% or less. The ratio Lp of the second radiance to the first radiance in the light emission of the light emitting device may be 5% or more, and may be 8% or more in order to emit light having good color rendering property.

The ratio Lp of the second radiance to the first radiance in the light emission of the light emitting device is calculated by the following formula (6). The ratio Lp of the second radiance in the range of 650 nm or more and 750 nm or less to 100% of the first radiance in the range of 400 nm or more and 750 nm or less in the light emission of the light emitting device refers to a ratio of light of the long wavelength red component, among the mixed color light emitted from the light emitting device.

$$Lp(\%) = \frac{\int_{650}^{750} S(\lambda)d\lambda}{\int_{400}^{750} S(\lambda)d\lambda} \times 100 \qquad (6)$$

The light emitting device preferably emits light having a first relative scattering index RS1 of 99.9% or less. The first relative scattering index RS1 refers to a ratio of the first scattering index B/L of the light emitting device that emits light having a correlated color temperature of 1,950 K or less, which is calculated from the formula (1), when a reference first scattering index $B_0/L_0$ is 100%. The reference first scattering index $B_0/L_0$ refers to a first scattering index of the lowest numerical value in the light emitting device to be measured that emits light having a correlated color temperature of more than 1,950 K and an average color rendering index Ra of 70 or more. When the first relative scattering index RS1 is 99.9% or less, the light emitting device emits light with suppressed scattering compared with a light emitting device that emits light having a correlated color temperature of more than 1,950 K and an average color rendering index Ra of 70 or more. The first relative scattering index RS1 is preferably 20% or more. When the light emitting device emits light having a first relative scattering index RS1 of less than 20%, the effect of suppressing scattering is increased, but the color balance of the light is collapsed and the color rendering property is lowered. In order to suppress scattering while satisfying the color rendering property with an average color rendering index Ra of 70 or more, the light emitting device preferably emits light having a first relative scattering index RS1 in a range of 20% or more and 99.9% or less. In the light emitting device that emits light having a correlated color temperature of 1,950 K or less, the first relative scattering index RS1 may be in a range of 30% or more and 99.5% or less, may be in a range of 40% or more and 99.0% or less, may be in a range of 50% or more and 98.5% or less, may be 70% or more, may be 80% or more, and may be 90% or more.

The reference first scattering index $B_0/L_0$ of the light emitting device that emits light having a correlated color temperature of more than 1,950 K and an average color rendering index Ra of 70 or more can be calculated by the following formula (7).

$$B_0/L_0 = \frac{\int_{300}^{800} Dc(\lambda) \times S_0(\lambda) d\lambda}{\int_{300}^{800} S_0(\lambda) \times V(\lambda) d\lambda} \quad (7)$$

wherein $S_0(\lambda)$ represents a spectral radiance of light emitted by the light emitting device having a correlated color temperature of more than 1,950 K and an average color rendering index Ra of 70 or more; and $Dc(\lambda)$ and $V(\lambda)$ are synonymous with those of the formula (1).

The first relative scattering index RS1 (%) can be calculated by the following formula (8).

$$RS1 = \frac{\int_{300}^{800} Dc(\lambda) \times S(\lambda) d\lambda \Big/ \int_{300}^{800} S(\lambda) \times V(\lambda) d\lambda}{\int_{300}^{800} Dc(\lambda) \times S_0(\lambda) d\lambda \Big/ \int_{300}^{800} S_0(\lambda) \times V(\lambda) d\lambda} \times 100 \quad (8)$$

The light emitting device preferably emits light having a second relative scattering index RS2 of 99.9% or less. The second relative scattering index RS2 refers to a ratio of the second scattering index B/A of the light emitting device that emits light having a correlated color temperature of 1,950 K or less, which is calculated from the formula (2), when a reference second scattering index $B_0/A_0$ is 100%. The reference second scattering index $B_0/A_0$ refers to a second scattering index of the lowest numerical value in the light emitting device to be measured that emits light having a correlated color temperature of more than 1,950 K and an average color rendering index Ra of 70 or more. When the second relative scattering index RS2 is 99.9% or less, the light emitting device emits light with suppressed scattering compared with a light emitting device that emits light having a correlated color temperature of more than 1,950 K and an average color rendering index Ra of 70 or more, even when the photopic standard specific luminous sensitivity of humans is not taken into consideration. The second relative scattering index RS2 is preferably 20% or more. When the light emitting device emits light having a second relative scattering index RS2 of less than 20%, the effect of suppressing scattering is increased, but the color balance of the light is collapsed and the color rendering property is lowered. In order to suppress scattering while satisfying the color rendering property with an average color rendering index Ra of 70 or more, the light emitting device preferably emits light having a second relative scattering index RS2 in a range of 20% or more and 99.9% or less. In the light emitting device that emits light having a correlated color temperature of 1,950 K or less, the second relative scattering index RS2 may be in a range of 30% or more and 99.8% or less, may be in a range of 40% or more and 99.5% or less, may be in a range of 50% or more and 99.0% or less, may be in a range of 70% or more and 98.0% or less, may be in a range of 80% or more and 95.0% or less, and may be 90% or more.

The reference second scattering index $B_0/A_0$ of the light emitting device that emits light having a correlated color temperature of more than 1,950 K and an average color rendering index Ra of 70 or more can be calculated by the following formula (9).

$$B_0/A_0 = \frac{\int_{300}^{800} Dc(\lambda) \times S_0(\lambda) d\lambda}{\int_{300}^{800} S_0(\lambda) d\lambda} \quad (9)$$

wherein $S_0(\lambda)$ represents a spectral radiance of light emitted by the light emitting device having a correlated color temperature of more than 1,950 K and an average color rendering index Ra of 70 or more; and $Dc(\lambda)$ is synonymous with that of the formula (2).

The second relative scattering index RS2 (%) can be calculated by the following formula (10).

$$RS2 = \frac{\int_{300}^{800} Dc(\lambda) \times S(\lambda) d\lambda \Big/ \int_{300}^{800} S(\lambda) d\lambda}{\int_{300}^{800} Dc(\lambda) \times S_0(\lambda) d\lambda \Big/ \int_{300}^{800} S_0(\lambda) d\lambda} \times 100 \quad (10)$$

Figure 4:
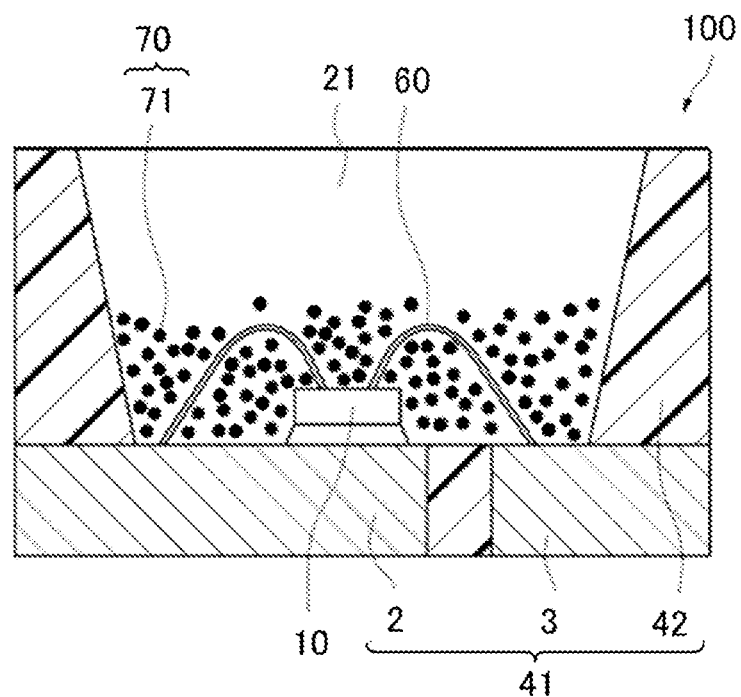
FIG. 4 is a schematic cross-sectional view showing an exemplary light emitting device of a first embodiment.
Figure 5:
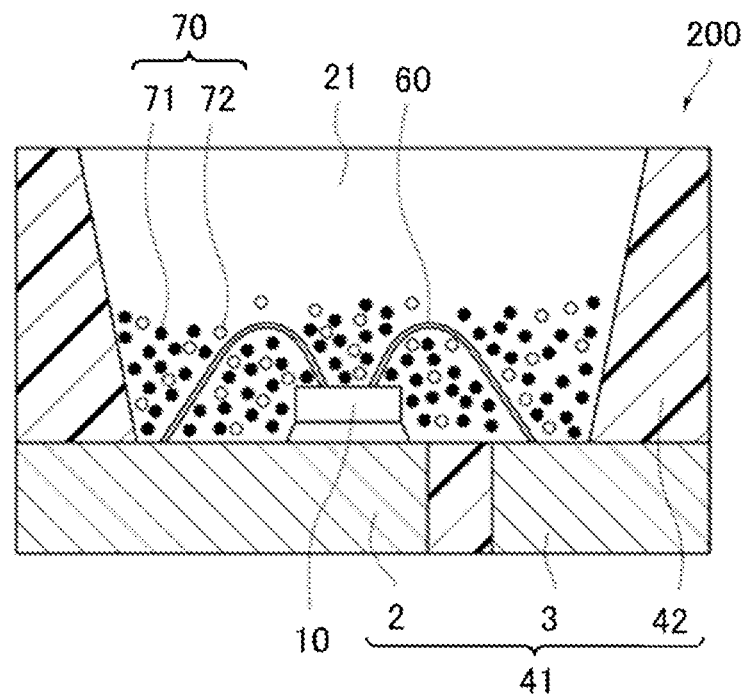
FIG. 5 is a schematic cross-sectional view showing an example of a light emitting device of a first embodiment of the present disclosure.

An example of the light emitting device will be described with reference to the drawings. FIGS. 4 and 5 each show a schematic cross-sectional view of a light emitting device of a first embodiment.

As shown in FIG. 4, the light emitting device 100 includes a light emitting element 10 having a light emission peak wavelength in a range of 400 nm or more and 490 nm or less, and a first fluorescent material 71 that is excited by light emitted by the light emitting element for light emission.

The light emitting device 100 includes a molded body 41, a light emitting element 10, and a wavelength conversion member 21. The molded body 40 is formed by integrally molding a first lead 2, a second lead 3, and a resin portion 42 containing a thermoplastic resin or a thermosetting resin. The molded body 41 forms a recessed portion having a bottom surface and side surfaces, in which the light emitting element 10 is mounted on the bottom surface of the recessed portion. The light emitting element 10 has a pair of positive and negative electrodes, and the pair of positive and negative electrodes each are electrically connected to the first lead 2 and the second lead 3 via a wire 60. The light emitting element 10 is covered by the wavelength conversion member 21. The wavelength conversion member 21 includes, for example, a fluorescent material 70 that undergoes wavelength conversion of light emitted from the light emitting element 10, and a translucent material. The wavelength conversion member 21 also has a function as a sealing member for covering the light emitting element 10 and the fluorescent material 70 in the recessed portion of the molded body 40. The fluorescent material 70 contains a first fluorescent material 71 that is excited by light emitted by the light emitting element and has a light emission peak wavelength in a range of 570 nm or more and 680 nm or less. The first lead 2 and the second lead 3 connected to the pair of positive and negative electrodes of the light emitting element 10 are partly exposed to the outside of the package constituting the light emitting device 100. The light emitting device 100 is able to emit light upon receiving external power supply via the first lead 2 and second lead 3.

As shown in FIG. 5, the light emitting device 200 is the same as the light emitting device 100 shown in FIG. 4, except that the fluorescent material 70 contains a second fluorescent material 72 having a light emission peak wavelength in a range of 480 nm or more and 570 nm or less; and the same members are designated by the same reference numerals.

The wavelength conversion member in the light emitting device of the first embodiment includes a fluorescent material and a translucent material, and the translucent material is preferably a resin. Examples of the translucent material used in the wavelength conversion member include at least one selected from the group consisting of a resin, glass, and an inorganic substance. The resin is preferably at least one selected from the group consisting of an epoxy resin, a silicone resin, a phenol resin, and a polyimide resin. Examples of the inorganic substance include at least one selected from the group consisting of aluminum oxide and aluminum nitride. The wavelength conversion member may optionally include a filler, a colorant, and a light diffusing material in addition to the fluorescent material and the translucent material. Examples of the filler include silicon oxide, barium titanate, titanium oxide, and aluminum oxide. As for the content of the other components than the fluorescent material and the translucent material contained in the wavelength conversion member, the total content of the other components is in a range of 0.01 part by mass or more and 50 parts by mass or less, may be in a range of 0.1 part by mass or more and 45 parts by mass or less, and may be in a range of 0.5 part by mass or more and 40 parts by mass or less, relative to 100 parts by mass of the translucent material.

Method for Producing Light Emitting Device of First Embodiment

A method for producing a light emitting device of the first embodiment will be described. For the details, for example, the disclosure of Japanese Unexamined Patent Publication No. 2010-062272 may be referred to. The method for producing a light emitting device preferably includes a step of preparing a molded body, a step of arranging a light emitting element, a step of arranging a wavelength conversion member-forming composition, and a step of forming a resin package. When using an aggregated molded body having a plurality of recessed portions as the molded body, the production method may include an individualizing step of separating each resin package in each unit region after the step of forming a resin package.

In the step of preparing a molded body, a plurality of leads are integrally molded using a thermosetting resin or a thermoplastic resin to prepare a molded body having a recessed portion with side surfaces and a bottom surface. The molded body may be formed from an aggregated substrate including a plurality of recessed portions.

In the step of arranging a light emitting element, a light emitting element is arranged on the bottom surface of the recessed portion of the molded body, and the positive and negative electrodes of the light emitting element are connected to a first lead and a second lead, respectively, by a wire.

In the step of arranging a wavelength conversion member-forming composition, a wavelength conversion member-forming composition is arranged in the recessed portion of the molded body.

In the step of forming a resin package, the wavelength conversion member-forming composition arranged in the recessed portion of the molded body is cured to form a resin package, thereby producing a light emitting device. When using a molded body formed from an aggregated substrate having a plurality of recessed portions, in the individualizing step after the step of forming a resin package, the resin package is separated for each resin package in each unit region of the aggregated substrate having a plurality of recessed portions, thereby producing individual light emitting devices. As described above, the light emitting device of the first embodiment shown in each of FIG. 4 and FIG. 5 can be produced.

Figure 6:
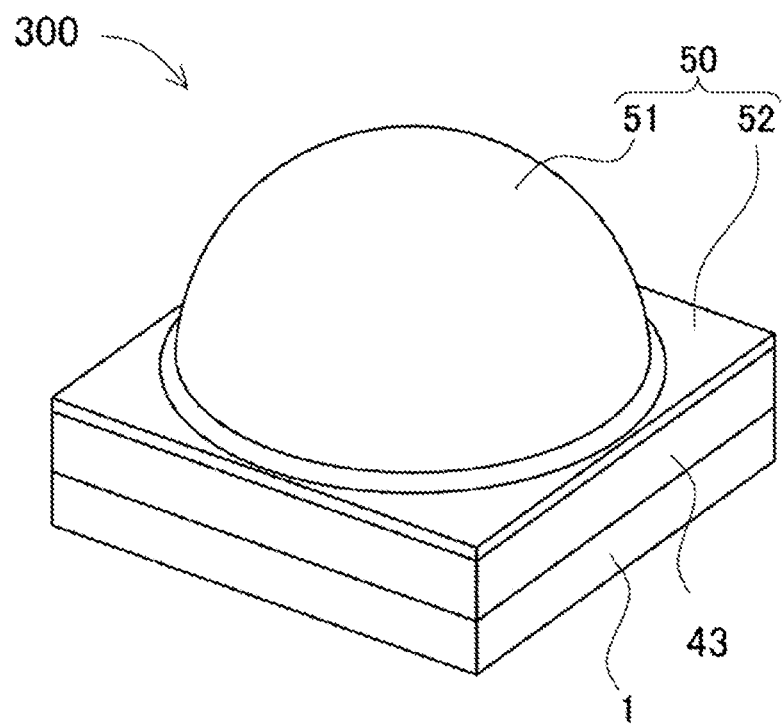
FIG. 6 is a schematic perspective view showing an exemplary light emitting device of a second embodiment.
Figure 7:
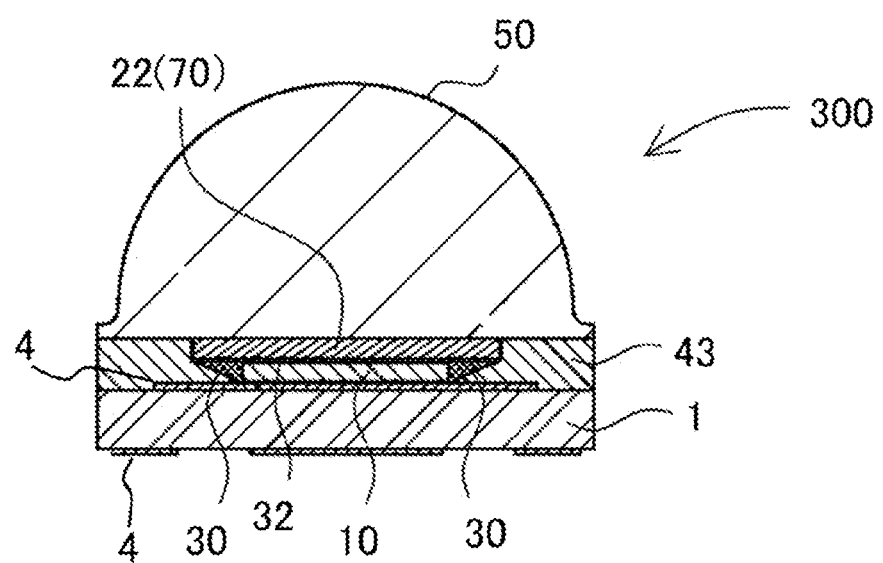
FIG. 7 is a schematic cross-sectional view showing an exemplary light emitting device of a second embodiment.

FIG. 6 shows a schematic perspective view of a light emitting device of a second embodiment. FIG. 7 shows a schematic cross-sectional view of the light emitting device of the second embodiment.

As shown in FIGS. 6 and 7, the light emitting device 300 includes a support 1, a light emitting element 10 arranged on the support 1, a wavelength conversion member 22 including a fluorescent material 70 arranged on the upper surface of the light emitting element 10, and a light reflecting member 43 arranged on the support 1 at the side of the wavelength conversion member 22 and the light emitting element 10. The light emitting device 300 also includes a sealing member 50 arranged on the upper surface of the wavelength conversion member 22. The sealing member 50 includes a lens portion 51 that is circular in a plan view and semicircular in a cross-sectional view, and a flange portion 52 that is extended from the outer peripheral side of the lens portion 51. The lens portion 51 has a circular shape in a plan view and a semicircular spherical shape in a cross-sectional view. The flange portion 52 is extended from the outer peripheral side of the lens portion 51.

The wavelength conversion member 22 is formed larger than the light emitting element 10 in a plan view. In addition, a translucent member 30 in contact with the side surface of the light emitting element 10 and a part of the wavelength conversion member 22 is provided between the side surface of the light emitting element 10 and the light reflecting member 43. The translucent member 30 includes a translucent bonding member 32 provided between the light emitting element 10 and the wavelength conversion member 22. The translucent bonding member 32 can be an adhesive material that bonds the light emitting element 10 and the wavelength conversion member 22. The translucent bonding member 32 may be partially extended to the corner formed by the side surface of the light emitting element 10 and the main surface of the wavelength conversion member 22 on the light emitting element 10 side. As shown in FIG. 7, the cross-sectional shape of the extended translucent bonding member 32 may be an inverted triangle extending in the direction of the light reflecting member 43. The translucent member 30 and the bonding member 32 may use a translucent resin. The support 1 is a member for mounting the light emitting element 10, the sealing member 50, and the like on the upper surface. The support 1 includes an insulating base material and a conductive member 4 such as a wiring pattern for mounting a light emitting element on the surface of the base material. The light reflecting member 43 is a member for covering the translucent member 30, the bonding member 32, and the wavelength conversion member 22. For the details of the light emitting device of the second embodiment and the method for producing a light emitting device of the second embodiment described below, for example, the disclosure of Japanese Unexamined Patent Publication No. 2020-057756 may be referred to.

The wavelength conversion member in the light emitting device of the second embodiment includes a fluorescent material and a translucent material in the same manner as the wavelength conversion member in the light emitting device of the first embodiment. The fluorescent material contains a first fluorescent material that is excited by light emitted by the light emitting element and has a light emission peak wavelength in a range of 570 nm or more and 680 nm or less. The fluorescent material may include a second fluorescent material that is excited by light emitted by the light emitting element and has a light emission peak wavelength in a range of 480 nm or more and 570 nm or less. The translucent material may use the same translucent material as that used for the wavelength conversion member in the light emitting device of the first embodiment. The wavelength conversion member in the light emitting device of the second embodiment may optionally include a filler, a colorant, and a light diffusing material in addition to the fluorescent material and the translucent material, in the same manner as the wavelength conversion member in the light emitting device of the first embodiment.

Method for Producing Light Emitting Device of Second Embodiment

An example of the method for producing a light emitting device of the second embodiment will be described. The method for producing a light emitting device of the second embodiment includes a step of arranging a light emitting element, a step of preparing a wavelength conversion member, a step of forming a translucent member and a bonding member, a step of arranging a light reflecting member, and a step of arranging a sealing member; and may include an individualizing step of separating each unit region.

In the step of arranging a light emitting element, a light emitting element is flip-chip mounted on a support prepared in advance. In the step of preparing a wavelength conversion member, a wavelength conversion member-forming composition containing a fluorescent material and a translucent material is cured to form a plate, a sheet, or a layer in advance, and then individualized into a size that can be arranged on the light emitting element, to thereby prepare a plate-shaped, sheet-shaped, or layered wavelength conversion member. In the step of forming a translucent member and a bonding member, a translucent adhesive material is applied to the upper surface of the light emitting element, and the wavelength conversion member is bonded to the upper surface of the light emitting element. The adhesive material protruding from the interface between the light emitting element and the wavelength conversion member extends and adheres from the side surface of the light emitting element to the periphery of the wavelength conversion member, and is cured in the form of a fillet to form a translucent member and a bonding member. In the step of arranging a light reflecting member, a white resin is arranged and cured so as to cover the side surfaces of the wavelength conversion member and the translucent member on the upper surface of the support, thereby arranging a light reflecting member. Finally, a sealing member is arranged on the upper surface of the wavelength conversion member and the light reflecting member. Thus, the light emitting device of the second embodiment can be produced.

Figure 8:
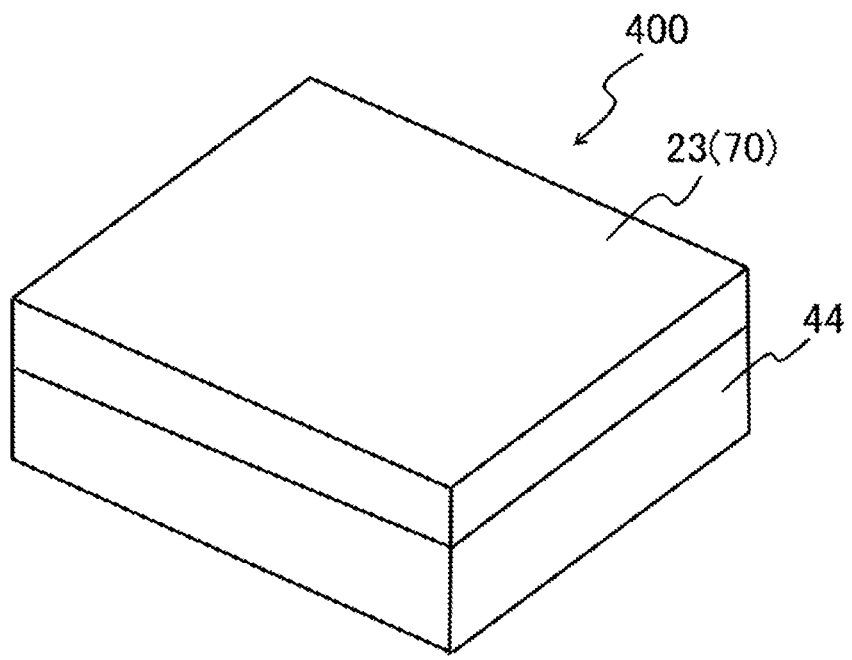
FIG. 8 is a schematic perspective view showing an exemplary light emitting device of a third embodiment.
Figure 9:
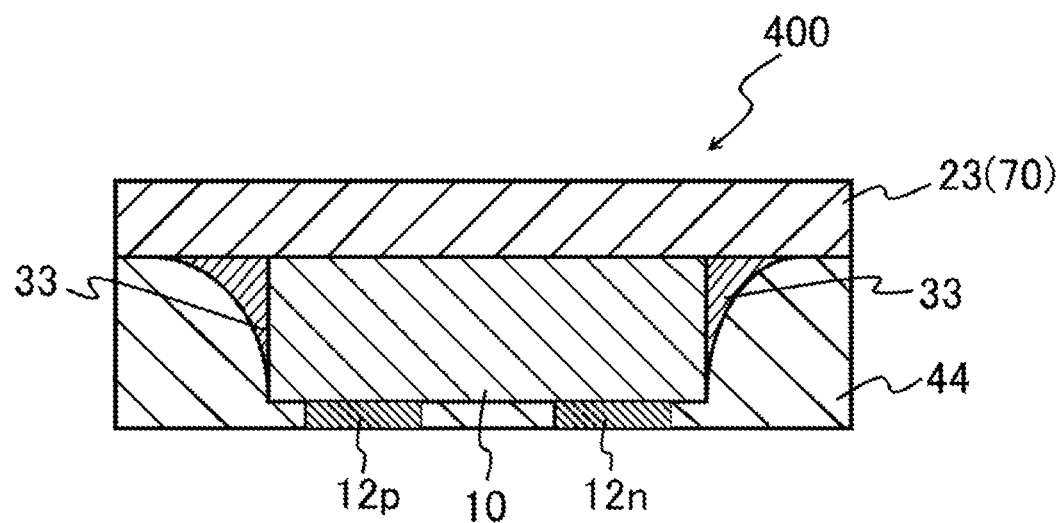
FIG. 9 is a schematic cross-sectional view showing an exemplary light emitting device of a third embodiment.

FIG. 8 shows a schematic perspective view of a light emitting device of a third embodiment. FIG. 9 shows a schematic cross-sectional view of the light emitting device of the third embodiment.

As shown in FIGS. 8 and 9, the light emitting device 400 has a substantially rectangular external shape. The light emitting device 400 includes a light emitting element 10, a covering member 44, and a wavelength conversion member 23 including a fluorescent material 70. A translucent member 33 in contact with the side surface of the light emitting element 10 and a part of the wavelength conversion member 23 is provided between the side surface of the light emitting element 10 and the covering member 44. The translucent member 33 can be an adhesive material that bonds the light emitting element 10 and the wavelength conversion member 23. The covering member 44 is arranged so as to cover the lower surface of the light emitting element 10, electrodes 12p and 12n, the side surface of the translucent member 33, and the lower surface of the wavelength conversion member 23. The covering material 44 is light-reflective and directly or indirectly covers the side surface of the light emitting element 10. The outer surface of the covering member 44 constitutes the side surface of the light emitting device 400 together with the side surface of the wavelength conversion member 23. The outer surface of the covering member 44 and the side surface of the wavelength conversion member 23 are preferably the same surface. The covering member 44 covers the pair of electrodes 12p and 12n of the light emitting device 10 such that at least a part of each electrode is exposed. The lower surface of the covering member 44 constitutes a part of the lower surface of the light emitting device 400. For the details of the light emitting device of the third embodiment and the method for producing the same, for example, the disclosure of Japanese Unexamined Patent Publication No. 2019-009429 may be referred to.

Method for Producing Light Emitting Device of Third Embodiment

An outline of the method for producing a light emitting device of the third embodiment will be described. The method for producing a light emitting device of the third embodiment includes a step of preparing a wavelength conversion member, a step of arranging a translucent member and a light emitting element, a step of forming a translucent member, and a step of forming a covering member; and may include a step of exposing electrodes and an individualizing step of separating each unit region, after the step of forming a covering member.

In the step of preparing a wavelength conversion member, a wavelength conversion member-forming composition containing a fluorescent material and a translucent material is cured to form a plate-shaped, a sheet-shaped, or a layered wavelength conversion member in advance. In the step of arranging a translucent member and a light emitting element, a translucent adhesive material is applied to the upper surface of the wavelength conversion member to arrange a light emitting element thereon. In the step of forming a translucent member, the adhesive material protruding from the interface between the light emitting element and the wavelength conversion member extends and adheres from the side surface of the light emitting element to the periphery of the wavelength conversion member, and is cured in the form of a fillet to form a translucent member. In the step of forming a covering member, a covering member is formed on the wavelength conversion member so as to embed the light emitting element. Apart of the covering member is removed to expose electrodes of the light emitting element. If necessary, the resulting product is cut into pieces for each unit region for individualization. Thus, the light emitting device of the third embodiment can be produced.

Light Fixture

The light fixture may include at least one of the above-mentioned light emitting devices. The light fixture is constituted by including the above-mentioned light emitting devices, and it may further include members such as a reflecting member, a protecting member, and an attachment device for supplying electricity to the light emitting device. The light fixture may include plural light emitting devices. In the case where the light fixture includes plural light emitting devices, plural identical light emitting devices may be provided, and light emitting devices having different forms may also be provided. In addition, the light fixture may include a drive device capable of individually driving plural light emitting devices and adjusting the brightness and the like of the individual light emitting devices. A form of use of the light fixture may be any of a direct attaching-type, an embedding-type, and a pendant-type. The light fixture may be one designed to be installed outdoors, such as street lights, harbors, and tunnels; may be one designed to be used outdoors, such as headlights, flashlights, and portable lanterns using LEDs; and may be one installed indoors but in places close to the outdoors, such as near windows.

Street Light

Figure 10:
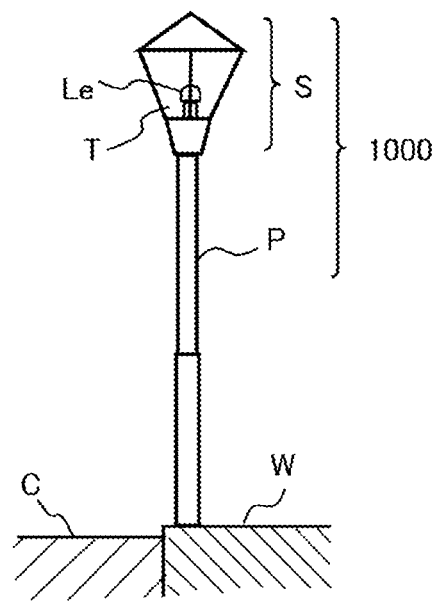
FIG. 10 is a diagram showing an exemplary street light.

The street light may include at least one of the above-mentioned light emitting devices. FIG. 10 shows an example of the street light. The street light 1000 includes a pole P to be installed on a sidewalk W or a roadway C, and a support portion S for a light emitting device Le; and the support portion S includes a light transmitting portion T made of acrylic, polycarbonate, glass, or the like, which covers the periphery of the light emitting device Le and transmits at least a part of light emitted by the light emitting device Le. The street light 1000 is capable of illuminating low places from high places by the light emitting device Le installed in the support portion S integrated with the pole P. The street light is not limited to the example shown in FIG. 10.

The street light may be a pole-type street light equipped with a pole that allows the height of the support portion to be set arbitrarily; may be a bracket-type street light in which the support portion is supported with a bracket instead of a pole; may be a floodlight-type street light that illuminates upward from below; and may be a landscape material-embedded-type street light that is incorporated into a landscape material such as a pillar or a block.

EXAMPLES

The present disclosure is hereunder specifically described by reference to the following Examples. The present disclosure is not limited to these Examples.

For the light emitting device of each of Examples and Comparative Examples, the following first fluorescent material and/or the second fluorescent material was used.

First Fluorescent Material

As the first fluorescent material, second nitride fluorescent materials SCASN-2, SCASN-3, SCASN-4, and SCASN-6 contained in the composition represented by the formula (1B), a fluoride fluorescent material KSF contained in the composition represented by the formula (1C), and a second nitride fluorescent material CASN contained in the composition represented by the formula (1B) (wherein q=0), each of which had a different light emission peak wavelength and full width at half maximum as shown in Table 1, were prepared.

Second Fluorescent Material

As the second fluorescent material, a rare earth aluminate fluorescent material LAG, which was $Lu_3Al_5O_{12}$:Ce, contained in the composition represented by the formula (2A), rare earth aluminate fluorescent materials G-YAG1, G-YAG3, and G-YAG4, which were $Y_3(Al,Ga)_5O_{12}$:Ce (wherein a satisfied $0<a\leq0.5$), contained in the composition represented by the formula (2A), and rare earth aluminate fluorescent materials YAG1 and YAG2, which were $Y_3Al_5O_{12}$:Ce, contained in the composition represented by the formula (2A), each of which had a different light emission peak wavelength and full width at half maximum as shown in Table 2, were prepared.

Measurement of Light Emission Spectrum of Fluorescent Material

Each fluorescent material was irradiated with light having an excitation wavelength of 450 nm using a quantum efficiency measurement apparatus (QE-2000, manufactured by Otsuka Electronics Co., Ltd.) to measure the light emission spectrum at room temperature (approximately 25° C.), and the light emission peak wavelength and the full width at half maximum were determined from each light emission spectrum. The results are shown in Tables 1 and 2.

TABLE 1

|  | Light emission peak wavelength (nm) | Full width at half maximum (nm) |
| --- | --- | --- |
| SCASN2 | 612 | 74.6 |
| SCASN3 | 620 | 72.9 |
| SCASN4 | 628 | 75.4 |
| SCASN6 | 642 | 96.4 |
| CASN | 651 | 93.7 |
| KSF | 631 | 7.2 |

TABLE 2

|  | Light emission peak wavelength (nm) | Full width at half maximum (nm) |
| --- | --- | --- |
| LAG | 536 | 105.2 |
| G-YAG1 | 539 | 106.8 |
| G-YAG3 | 551 | 109.6 |
| G-YAG4 | 557 | 111.7 |
| YAG1 | 548 | 111.2 |
| YAG2 | 560 | 114.8 |

Example 1

A light emitting device 200 of the first embodiment was produced. Here, the light emitting device 200 of the first embodiment can be referred to the one shown in FIG. 5, which contains the first fluorescent material 71 and the second fluorescent material 72.

A light emitting element on which a nitride semiconductor layer having a light emission peak wavelength of 450 nm was laminated was used as the light emitting element 10. The size of the light emitting element 10 was a substantially square having a planar shape of approximately 700 mm square, and the thickness was approximately 200 mm.

A lead frame was used as the first lead 2 and the second lead 3, and the first lead 2 and the second lead 3 were integrally molded using an epoxy resin to prepare a molded body 41 having a recessed portion with side surfaces and a bottom surface.

The light emitting element 10 was arranged on the bottom surface of the recessed portion of the molded body 41, and the positive and negative electrodes of the light emitting element 10 were connected to the first lead 2 and the second lead 3, respectively, by a wire 60 made of Au.

A silicone resin was used as the translucent material constituting the wavelength conversion member 21. Fluorescent materials shown in Table 3 were used as the first fluorescent material 71 and the second fluorescent material 72.

In the wavelength conversion member-forming composition, in order to obtain a correlation color temperature of the mixed color light of the light emitted from the light emitting element 10 and the light emitted from the fluorescent material 70 containing the first fluorescent material 71 and the second fluorescent material 72 being around 1,850 K, the first fluorescent material 71 and the second fluorescent material 72 were blended as shown in Table 3, relative to 100 parts by mass of the translucent material. In the wavelength conversion member-forming composition, 2 parts by mass of aluminum oxide was also blended as a filler relative to 100 parts by mass of the silicone resin. Next, the prepared wavelength conversion member-forming composition was filled in the recessed portion of the molded body 41.

The wavelength conversion member-forming composition filled in the recessed portion of the molded body 41 was cured by heating at 150° C. for 3 hours to form a resin package including the wavelength conversion member 21 containing the first fluorescent material 71 and the second fluorescent material 72, thereby producing a light emitting device 200 of the first embodiment capable of emitting light having a correlated color temperature of 1,950 K or less.

Example 2

A light emitting device 200 of the first embodiment was produced. Here, the light emitting device 200 of the first embodiment can be referred to the one shown in FIG. 5, which contains the first fluorescent material 71 and the second fluorescent material 72.

A light emitting device 200 of the first embodiment capable of emitting light having a correlated color temperature of 1,950 K or less was produced in the same manner as in Example 1, except that in the step of preparing a wavelength conversion member, in order to obtain a correlation color temperature of the mixed color light of the light emitted from the light emitting element 10 and the light emitted from the fluorescent material 70 containing the first fluorescent material 71 and the second fluorescent material 72 being around 1,850 K, the wavelength conversion member-forming composition containing the first fluorescent material 71 and the second fluorescent material 72 was prepared such that the total amount of the fluorescent material 70 relative to 100 parts by mass of the translucent material and the blending ratio of the first fluorescent material 71 and the second fluorescent material 72 were the amounts shown in Table 3.

Example 3

A light emitting device 200 of the first embodiment was produced. Here, the light emitting device 200 of the first embodiment can be referred to the one shown in FIG. 5, which contains the first fluorescent material 71 and the second fluorescent material 72.

A phenyl silicone resin was used as the translucent material constituting the wavelength conversion member 21. Fluorescent materials shown in Table 3 were used as the first fluorescent material 71 and the second fluorescent material 72.

In the wavelength conversion member-forming composition, in order to obtain a correlation color temperature of the mixed color light of the light emitted from the light emitting element 10 and the light emitted from the fluorescent material 70 containing the first fluorescent material 71 and the second fluorescent material 72 being around 1,850 K, the first fluorescent material 71 and the second fluorescent material 72 were blended as shown in Table 3, relative to 100 parts by mass of the translucent material. In the wavelength conversion member-forming composition, 15 parts by mass of silicon dioxide was also blended as a filler relative to 100 parts by mass of the phenyl silicone resin. Next, the prepared wavelength conversion member-forming composition was filled in the recessed portion of the molded body 41.

The wavelength conversion member-forming composition filled in the recessed portion of the molded body 41 was cured by heating at 150° C. for 4 hours to form a resin package including the wavelength conversion member 21 containing the first fluorescent material 71 and the second fluorescent material 72, thereby producing a light emitting device 200 of the first embodiment capable of emitting light having a correlated color temperature of 1,950 K or less.

Example 4

A light emitting device 400 of the third embodiment was produced. Here, the light emitting device 300 of the third embodiment can be referred to the one shown in FIGS. 8 and 9.

Step of Preparing Wavelength Conversion Member

A silicone resin was used as the translucent material constituting the wavelength conversion member 23. Fluorescent materials shown in Table 3 were used as the first fluorescent material and the second fluorescent material. In the wavelength conversion member-forming composition, in order to obtain a correlation color temperature of the mixed color light of the light emitted from the light emitting element 10 and the light emitted from the fluorescent material 70 containing the first fluorescent material and the second fluorescent material being around 1,850 K, the first fluorescent material and the second fluorescent material were blended such that the total amount of the fluorescent material 70 relative to 100 parts by mass of the translucent material and the blending ratio of the first fluorescent material and the second fluorescent material were the amounts shown in Table 3. In the wavelength conversion member-forming composition, 2 parts by mass of aluminum oxide was blended as a filler relative to 100 parts by mass of the silicone resin. Next, the prepared wavelength conversion member-forming composition was heated at 180° C. for 2 hours to be cured into a sheet, thereby preparing a sheet-shaped wavelength conversion member 22.

Step of Arranging Translucent Member and Light Emitting Element

A phenyl silicone resin, which was a translucent adhesive material, was applied to the upper surface of the wavelength conversion member 23 to bond the same light emitting element 10 as in Example 1; and the translucent adhesive material was further applied to the interface between the light emitting element 10 and the wavelength conversion member 23, and cured at 150° C. for 4 hours to form a translucent member 33, which was cured in a fillet shape, so as to extend from the side surface of the light emitting element 10 to the periphery of the wavelength conversion member 23.

Step of Forming Covering Member

A covering member-forming composition containing a phenyl silicone resin and titanium oxide particles having an average particle diameter of 0.25 μm (catalog value), in which the amount of the titanium oxide particles was 60 parts by mass relative to 100 parts by mass of the phenyl silicone resin, was prepared. The covering member-forming composition, which was a white resin, was arranged on the upper surface of the wavelength conversion member 23 so as to cover the side surfaces of the wavelength conversion member 23 and the translucent member 33 and to embed the light emitting element 10, and was then cured to form a covering member 44. A part of the covering member 44 was removed to expose electrodes 12p and 12n of the light emitting element 10. The resulting product was individualized into a size having a substantially square in a planar shape of approximately 1.1 mm square, which was approximately 0.195 mm larger in length and width than the planar shape of the light emitting element 10, and a total thickness including the wavelength conversion member 33 and the covering member 44 of approximately 350 μm, thereby producing a light emitting device 400 of the third embodiment capable of emitting light having a correlated color temperature of 1,950 K or less.

Comparative Example 1

A light emitting device of the second embodiment was produced. Here, the light emitting device of the second embodiment can be referred to the one shown in FIGS. 6 and 7.

A light emitting device 400 of the third embodiment capable of emitting light having a correlated color temperature of 2,200 K or more was produced in the same manner as in Example 4, except that in the step of preparing a wavelength conversion member, in order to obtain a correlation color temperature of the mixed color light of the light emitted from the light emitting element 10 and the light emitted from the fluorescent material 70 containing the first fluorescent material 71 and the second fluorescent material 72 being around 2,200 K, the wavelength conversion member-forming composition containing the first fluorescent material 71 and the second fluorescent material 72 was prepared such that the total amount of the fluorescent material 70 relative to 100 parts by mass of the translucent material and the blending ratio of the first fluorescent material and the second fluorescent material were the amounts shown in Table 3.

Comparative Examples 2 and 3

A light emitting device 200 of the first embodiment was produced. Here, the light emitting device 200 of the first embodiment can be referred to the one shown in FIG. 5, which contains the first fluorescent material 71 and the second fluorescent material 72.

A light emitting device 200 of the first embodiment capable of emitting light having a correlated color temperature of more than 1,950 K and 2,000 K or less was produced in the same manner as in Example 3, except that in the step of preparing a wavelength conversion member, in order to obtain a correlation color temperature of the mixed color light of the light emitted from the light emitting element 10 and the light emitted from the fluorescent material 70 containing the first fluorescent material 71 and the second fluorescent material 72 being around 1,950 K, the wavelength conversion member-forming composition containing the first fluorescent material 71 and the second fluorescent material 72 was prepared such that the total amount of the fluorescent material 70 relative to 100 parts by mass of the translucent material and the blending ratio of the first fluorescent material and the second fluorescent material were the amounts shown in Table 3.

Each light emitting device was measured as follows. The results are shown in Table 3.

Light Emission Spectrum of Light Emitting Device

Figure 11:
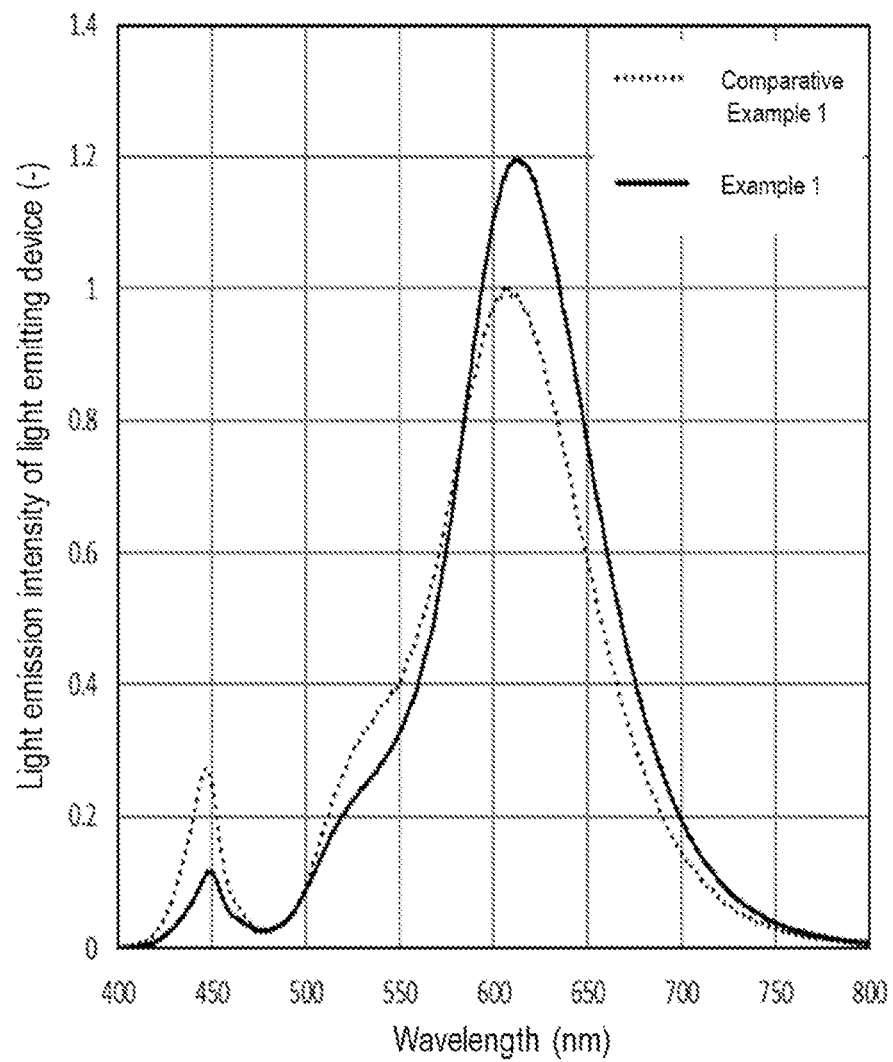
FIG. 11 is an exemplary graph showing spectral radiances of light emitting devices of Example 1 and Comparative Example 1.
Figure 12:
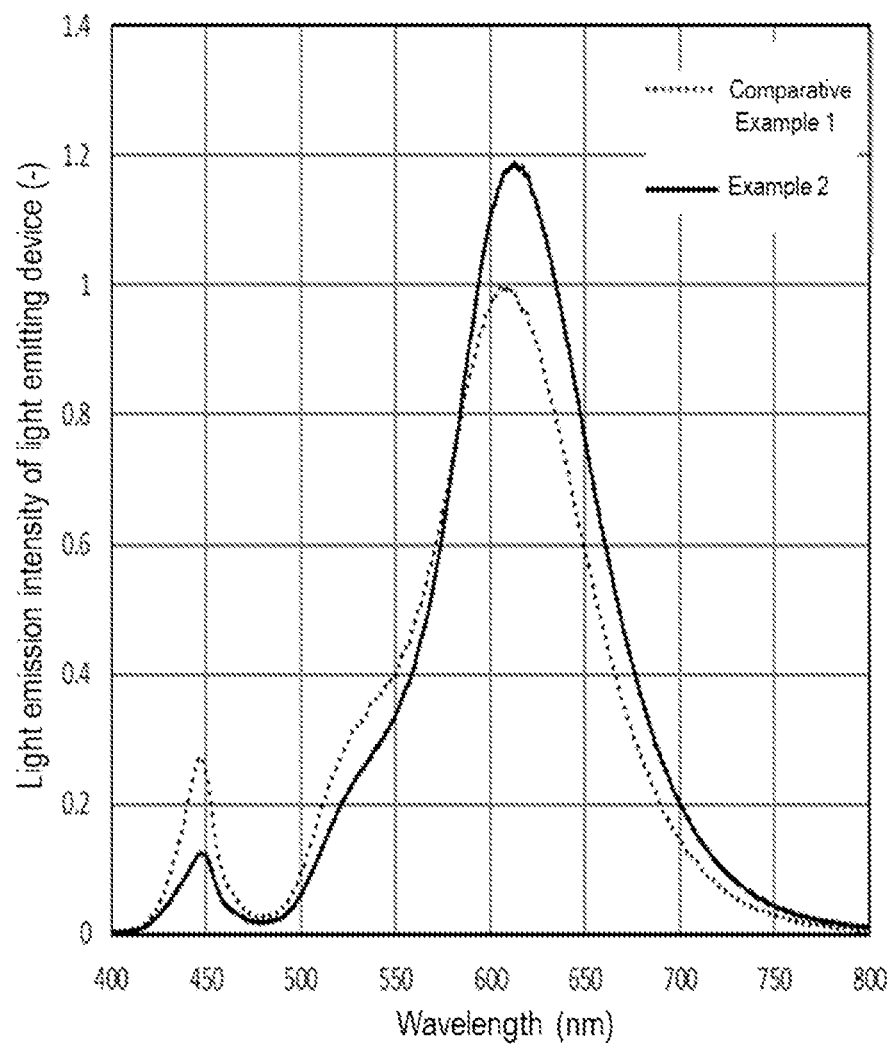
FIG. 12 is an exemplary graph showing spectral radiances of light emitting devices of Example 2 and Comparative Example 1.
Figure 13:
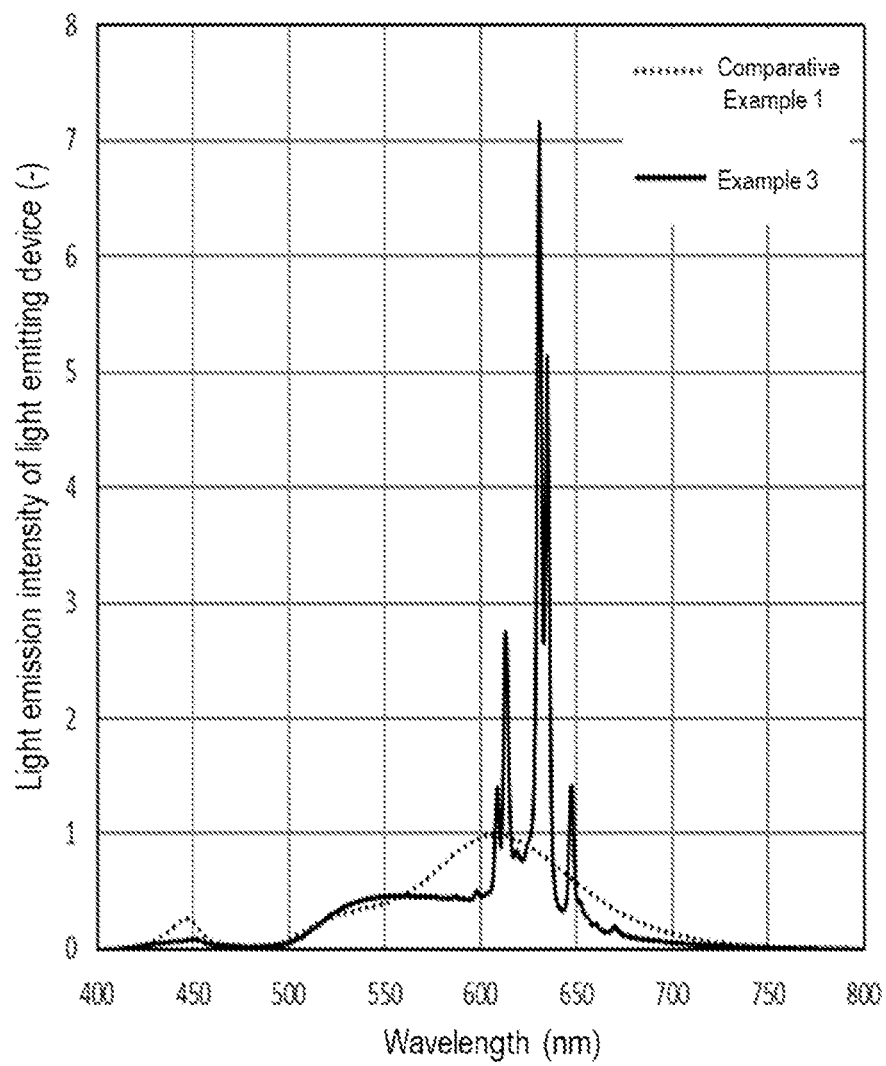
FIG. 13 is an exemplary graph showing spectral radiances of light emitting devices of Example 3 and Comparative Example 1.
Figure 14:
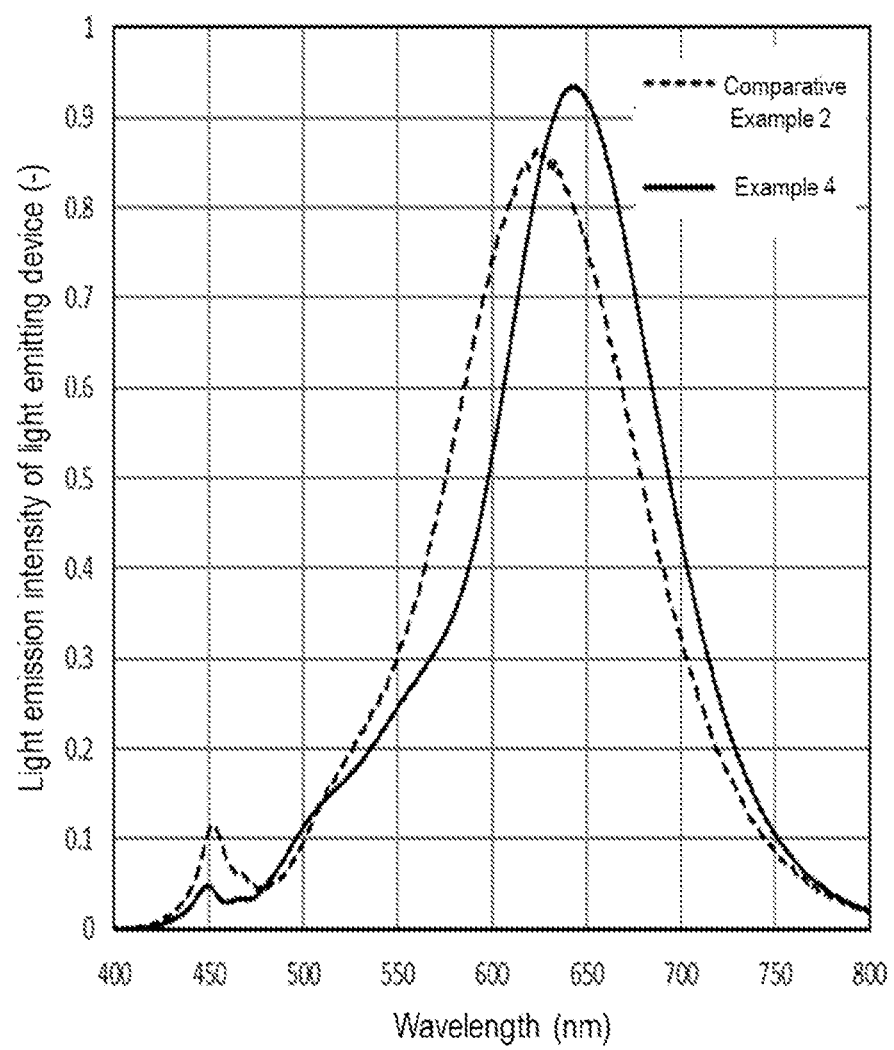
FIG. 14 is an exemplary graph showing spectral radiances of light emitting devices of Example 4 and Comparative Example 2.

For each light emitting device, the light emission spectrum was measured using an optical measurement system combining a spectrophotometer (PMA-12, Hamamatsu Photonics K.K.) and an integral sphere. The light emission spectrum of each light emitting device was measured at room temperature (20° C. to 30° C.). FIGS. 11 to 14 show the light emission spectrum (spectral radiance) $S(\lambda)$ of each light emitting device. FIGS. 11 to 13 show the light emission spectrum of each light emitting device when the luminance L derived from the above formula (3) of each light emitting device is set to the same value. FIG. 14 shows the light emission spectrum of each light emitting device when the radiance A derived from the above formula (5) of each light emitting device is set to the same value.

Chromaticity Coordinates (x, y), Correlated Color Temperature (K), Color Deviation Duv, Average Color Rendering Index Ra, Special Color Rendering Index R9, and Full Width at Half Maximum From the light emission spectrum of each light emitting device, the chromaticity coordinates (x and y values) on the CIE chromaticity diagram of CIE1931, the correlated color temperature (CCT: K) and color deviation Duv according to JIS Z8725, the average color rendering index Ra according to the JIS Z8726, the special color rendering index R9, and the full width at half maximum were measured.

Ratio Lp of Second Radiance to First Radiance

From the light emission spectrum (spectral radiance) $S(\lambda)$ of each light emitting device, the ratio Lp (%) of the second radiance in a range of 650 nm or more and 750 nm or less was calculated when the first radiance in a range of 400 nm or more and 750 nm or less was set to 100%, based on the above formula (6).

First Scattering Index B/L

The light emission spectrum (spectral radiance) $S(\lambda)$ measured for each light emitting device, the photopic standard specific luminous sensitivity curve of humans $V(\lambda)$ specified by CIE obtained from FIG. 1, and the scattering intensity curve $Dc(\lambda)$ for wavelengths when the scattering intensity of Rayleigh scattering at a wavelength of 300 nm was 1 in Rayleigh scattering obtained from FIG. 2 were substituted into the above formula (1) to determine a first scattering index B/L of each light emitting device.

First Relative Scattering Index RS1

The first scattering index of the light emitting device of Comparative Example 1, which had the lowest first scattering index B/L among the light emitting devices of Comparative Examples 1 and 2 that emitted light having a correlated color temperature of more than 1,950 K and an average color rendering index Ra of 70 or more, was defined as the reference first scattering index $B_0/L_0$. The first relative scattering index RS1, which was the ratio of the first scattering index B/L of each light emitting device to the reference first scattering index $B_0/L_0$, was calculated based on the formula (8).

Second Scattering Index B/A

The light emission spectrum (spectral radiance) $S(\lambda)$ measured for each light emitting device and the scattering intensity curve $Dc(\lambda)$ for wavelengths when the scattering intensity of Rayleigh scattering at a wavelength of 300 nm was 1 in Rayleigh scattering obtained from FIG. 2 were substituted into the above formula (2) to determine a second scattering index B/A of each light emitting device.

Second Relative Scattering Index RS2

The second scattering index of the light emitting device of Comparative Example 2, which had the lowest second scattering index B/A among the light emitting devices of Comparative Examples 1 and 2 that emitted light having a correlated color temperature of more than 1,950 K and an average color rendering index Ra of 70 or more, was defined as the reference second scattering index $B_0/A_0$. The second relative scattering index RS2, which was the ratio of the second scattering index B/A of each light emitting device to the reference second scattering index $B_0/A_0$, was calculated based on the formula (10).

TABLE 3

| | Fluorescent material | | Total amount of fluorescent material (parts by mass) | Mixing ratio (% by mass) | | Chromaticity coordinates | | Correlated color temperature CCT (K) | Color deviation Duv |
|---|---|---|---|---|---|---|---|---|---|
| | First fluorescent material | Second fluorescent material | | First fluorescent material | Second fluorescent material | x | y | | |
| Example 1 | SCASN4 | G-YAG3 | 118.8 | 11.9 | 88.1 | 0.543 | 0.410 | 1845 | 0.000 |
| Example 2 | SCASN4 | G-YAG4 | 120.8 | 11.8 | 88.2 | 0.543 | 0.410 | 1843 | 0.000 |
| Example 3 | KSF | YAG2 | 77.4 | 87.6 | 12.4 | 0.543 | 0.410 | 1842 | 0.000 |
| Example 4 | CASN | LAG | 305.0 | 23.5 | 76.5 | 0.544 | 0.410 | 1834 | 0.000 |
| Comparative Example 1 | SCASN3 | YAG1 | 170.0 | 17.0 | 83.0 | 0.503 | 0.418 | 2231 | −0.002 |
| Comparative Example 2 | SCASN6 | G-YAG1 | 120.0 | 16.3 | 83.7 | 0.528 | 0.413 | 1983 | 0.000 |
| Comperative Example 3 | SCASN2 | G-YAG1 | 108.0 | 27.4 | 72.6 | 0.527 | 0.413 | 1995 | 0.000 |

| | Average color rendering index Ra | Special color rendering index R9 | Full width at half maximum of light emission peak (nm) | Radiance ratio Lp (%) 650-750/400-750 | First scattering index B/L | First relative scattering index RS1 | Second scattering index B/A | Second relative scattering index RS2 |
|---|---|---|---|---|---|---|---|---|
| Example 1 | 75 | −17 | 87 | 21 | 0.146 | 96.5 | — | — |
| Example 2 | 73 | −21 | 98 | 21 | 0.146 | 96.2 | — | — |
| Example 3 | 86 | 92 | 6 | 8 | 0.149 | 96.5 | — | — |
| Example 4 | 95 | 91 | 101 | 41 | — | — | 0.056 | 92.1 |
| Comparative Example 1 | 70 | −36 | 95 | 17 | 0.152 | 100.0 | 0.072 | 117.5 |
| Comparative Example 2 | 84 | 27 | 118 | 31 | 0.182 | 106.9 | 0.061 | 100.0 |
| Comperative Example 3 | 61 | −66 | 80 | 15 | 0.140 | 92.1 | 0.070 | 114.1 | parative Examples 1 and 2 that emitted light having a correlated color temperature of more than 1,950 K and an average color rendering index Ra of 70 or more, was defined as the reference first scattering index $B_0/L_0$. The first relative scattering index RS1, which was the ratio of the first scattering index B/L of each light emitting device to the reference first scattering index $B_0/L_0$, was calculated based on the formula (8).

Second Scattering Index B/A

The light emission spectrum (spectral radiance) $S(\lambda)$ measured for each light emitting device and the scattering intensity curve $Dc(\lambda)$ for wavelengths when the scattering intensity of Rayleigh scattering at a wavelength of 300 nm As shown in Table 1, the light emitting devices according to Examples 1 to 4 had a correlated color temperature of 1,950 K or less, and emitted light having a correlated color temperature comparable to or slightly lower than that emitted by, for example, high-pressure sodium lamps. The light emitting devices according to Examples 1 to 4 emitted light that was natural in color of the irradiated object and did not cause discomfort, even when using, for example, as a light source for a light fixture used outdoors and as a substitute for high-pressure sodium lamps. In the light emitting devices according to Examples 1 to 4, the full width at half maximum of the light emission peak having the maximum light emission intensity in the light emission spectrum was in the range of 3 nm or more and 110 nm or less. The light emission peak wavelength in the light emission spectrum of each light emitting device was in the range of 570 nm or more and 680 nm or less. In each light emitting device, since the full width at half maximum of the light emission peak having the maximum light emission intensity in the light emission spectrum of the light emitting device was in the range of 3 nm or more and 110 nm or less, the component of light on the long wavelength side, which was difficult for humans to perceive, could be suppressed. Further, the light emitting devices according to Examples 1 to 3 emitted light with suppressed scattering where the first scattering index B/L derived from the formula (1) in consideration of photopic standard specific luminous sensitivity of humans was 0.151 or less. The light emitting device according to Example 4 emitted light with suppressed scattering where the second scattering index B/A derived from the formula (2) was 0.060 or less even when the photopic standard specific luminous sensitivity of humans was not taken into consideration.

The light emitting devices according to Examples 1 to 4 emitted light having a color deviation Duv, which was a deviation from the black body radiation locus, of 0.000, and emitted light that was natural in color of the irradiated object and did not cause discomfort to humans even when emitting light having a correlated color temperature of 1,950 K or less.

The light emitting devices according to Examples 1 to 4 emitted light having a ratio Lp of the second radiance in the range of 650 nm or more and 750 nm or less to 100% of the first radiance in the range of 400 nm or more and 750 nm or less being 50% or less. In the light emitting devices according to Examples 1 to 4, the red component was relatively small among the mixed color light emitted from the light emitting device, and the light that did not cause discomfort to humans was emitted.

The light emitting devices according to Examples 1 to 3 had a first relative scattering index RS1 of 98.5% or less, and emitted light where the scattering could be suppressed as compared with a light emitting device emitting light having a correlated color temperature of more than 1,950 K and an average color rendering index Ra of 70 or more.

The light emitting device according to Example 4 had a second relative scattering index RS2 of 92.1%, and emitted light where the scattering could be suppressed as compared with a light emitting device emitting light having a correlated color temperature of more than 1,950 K and an average color rendering index Ra of 70 or more.

The light emitting devices according to Examples 1 to 4 had an average color rendering index Ra of 70 or more, and emitted light having sufficient color rendering properties even in factories where general work was performed, offices, and schools.

The light emitting devices according to Comparative Examples 1 to 3 emitted light having a correlated color temperature slightly higher than that emitted by high-pressure sodium lamps, which was not natural in color of the irradiated object and could cause discomfort when using, for example, as a light source for a light fixture used outdoors and as a substitute for high-pressure sodium lamps. Further, the light emitting devices according to Comparative Examples 1 to 3 emitted light having a first scattering index B/L of more than 0.151, and scattering was not suppressed when the photopic standard specific luminous sensitivity of humans was taken into consideration. The light emitting devices according to Comparative Examples 1 to 3 emitted light having a second scattering index B/A of more than 0.060, and scattering was not suppressed even when the photopic standard specific luminous sensitivity of humans was not taken into consideration.

As shown in FIGS. 11 to 13, the spectral radiance of each of the light emitting devices according to Examples 1 to 3 was lower than that of the light emitting device according to Comparative Example 1 in the range of 400 nm or more and 500 nm or less on the short wavelength side where the light was easily scattered by fine particles in the air.

As shown in FIG. 14, the spectral radiance of the light emitting device according to Example 4 was lower than that of the light emitting device according to Comparative Example 2 in the range of 400 nm or more and 470 nm or less on the short wavelength side where the light was easily scattered by fine particles in the air.

The light emitting device according to the embodiments of the present disclosure can be used as a light source for street lights that are required to emit light with suppressed scattering, light fixtures installed outdoors such as harbors and tunnels, light fixtures that are expected to be used outdoors, such as headlights, flashlights, and portable lanterns using LEDs, and light fixtures installed indoors but in places close to the outdoors, such as near entrances and near windows.

The invention claimed is:

1. A light emitting device, comprising a light emitting element having a light emission peak wavelength in a range of 400 nm or more and 490 nm or less and a first fluorescent material having a light emission peak wavelength in a range of 570 nm or more and 680 nm or less, the light emitting device emitting light having a correlated color temperature being 1,950 K or less, an average color rendering index Ra being 70 or more, a full width at half maximum of a light emission peak having a maximum light emission intensity in a light emission spectrum of the light emitting device being 110 nm or less, and a first scattering index B/L of an effective radiance B to a luminance L, as defined by the following formula (1), being 0.151 or less, wherein L is the luminance of light emitted by the light emitting device in a range of 300 nm or more and 800 nm or less in consideration of a photopic standard specific luminous sensitivity curve of humans specified by CIE (Commission Internationale de l'Eclairage), and B is the effective radiance of light emitted by the light emitting device in a range of 300 nm or more and 800 nm or less in consideration of a scattering intensity curve for wavelengths when the scattering intensity of Rayleigh scattering at a wavelength of 300 nm is 1:

$$B/L = \frac{\int_{300}^{800} Dc(\lambda) \times S(\lambda) d\lambda}{\int_{300}^{800} S(\lambda) \times V(\lambda) d\lambda} \quad (1)$$

wherein $S(\lambda)$ represents a spectral radiance of light emitted by the light emitting device, $V(\lambda)$ represents a photopic standard specific luminous sensitivity curve of humans specified by CIE (Commission Internationale de l'Eclairage), and $Dc(\lambda)$ represents a scattering intensity curve for wavelengths when the scattering intensity of Rayleigh scattering at a wavelength of 300 nm is 1 in Rayleigh scattering.

2. The light emitting device according to claim 1, wherein the first fluorescent material has a full width at half maximum of a light emission peak having a light emission peak wavelength in a light emission spectrum of the first fluorescent material within a range of 3 nm or more and 120 nm or less.

3. The light emitting device according to claim 1, wherein the first fluorescent material comprises at least one selected from the group consisting of a first nitride fluorescent material having a composition represented by the following formula (1A), a second nitride fluorescent material having a composition represented by the following formula (1B), a fluoride fluorescent material having a composition represented by the following formula (1C), and a fluoride fluorescent material having a composition represented by the following formula (1C') that is different from that of the following formula (1C):

$$M^1_2Si_5N_8:Eu \tag{1A}$$

wherein $M^1$ represents an alkaline earth metal element containing at least one selected from the group consisting of Ca, Sr, and Ba;

$$Sr_qCa_sAl_tSi_uN_v:Eu \tag{1B}$$

wherein q, s, t, u, and v each satisfy 0≤q<1, 0<s≤1, q+s≤1, 0.9≤t≤1.1, 0.9≤u≤1.1, and 2.5≤v≤3.5;

$$A_c[M^2_{1-b}Mn^{4+}{}_bF_d] \tag{1C}$$

wherein A includes at least one selected from the group consisting of $K^+$, $Li^+$, $Na^+$, $Rb^+$, $Cs^+$, and $NH_4^+$, $M^2$ includes at least one element selected from the group consisting of Group 4 elements and Group 14 elements, b satisfies 0<b<0.2, c represents an absolute value of the charge of $[M^2_{1-b}Mn^{4+}{}_bF_d]$ ions, and d satisfies 5<d<7; and $$A'_{c'}[M^{2'}_{1-b'}Mn^{4+}{}_{b'}F_{d'}] \tag{1C'}$$

wherein A' includes at least one selected from the group consisting of $K^+$, $Li^+$, $Na^+$, $Rb^+$, $Cs^+$, and $NH_4^+$, $M^{2'}$ includes at least one element selected from the group consisting of Group 4 elements, Group 13 elements, and Group 14 elements, b' satisfies 0<b'<0.2, c' represents an absolute value of the charge of $[M^{2'}_{1-b'}Mn^{4+}{}_{b'}F_{d'}]$ ions, and d' satisfies 5<d'<7.

4. The light emitting device according to claim 1, comprising a second fluorescent material having a light emission peak wavelength in a range of 480 nm or more and 570 nm or less.

5. The light emitting device according to claim 4, wherein the second fluorescent material has a full width at half maximum of a light emission peak having a light emission peak wavelength in a light emission spectrum of the second fluorescent material within a range of 20 nm or more and 125 nm or less.

6. The light emitting device according to claim 4, wherein the second fluorescent material comprises at least one selected from the group consisting of a rare earth aluminate fluorescent material having a composition represented by the following formula (2A) and a third nitride fluorescent material having a composition represented by the following formula (2B):

$$Ln^1_3(Al_{1-a}Ga_a)_5O_{12}:Ce \tag{2A}$$

wherein $Ln^1$ includes at least one element selected from the group consisting of Y, Gd, Tb, and Lu, and a satisfies 0≤a≤0.5; and $$La_wLn^2{}_xSi_6N_y:Ce_z \tag{2B}$$

wherein $Ln^2$ includes at least one selected from the group consisting of Y and Gd, and optionally includes at least one selected from the group consisting of Sc and Lu, a total content of Y and Gd in $Ln^2$ is 90 mol % or more when a content of the $Ln^2$ in 1 mol of the composition is 100 mol %, and w, x, y, and z each satisfy 1.2≤w≤2.2, 0.5≤x≤1.2, 10≤y≤12, 0.5≤z≤1.2, 1.80<w+x<2.40, and 2.9≤w+x+z≤3.1.

7. The light emitting device according to claim 4, wherein an amount of the first fluorescent material relative to a total amount of the first fluorescent material and the second fluorescent material is in a range of 5% by mass or more and 95% by mass or less.

8. The light emitting device according to claim 1, emitting light having a color deviation Duv from a black body radiation locus within a range of minus (−) 0.008 or more and plus (+) 0.008 or less.

9. The light emitting device according to claim 1, emitting light having a second radiance in a range of 650 nm or more and 750 nm or less being 50% or less relative to 100% of a first radiance in a range of 400 nm or more and 750 nm or less.

10. A light fixture, comprising the light emitting device according to claim 1.

11. A street light, comprising the light emitting device according to claim 1.

12. A light emitting device, comprising a light emitting element having a light emission peak wavelength in a range of 400 nm or more and 490 nm or less and a first fluorescent material having a light emission peak wavelength in a range of 570 nm or more and 680 nm or less, the light emitting device emitting light having a correlated color temperature being 1,950 K or less, an average color rendering index Ra being 70 or more, a full width at half maximum of a light emission peak having a maximum light emission intensity in a light emission spectrum of the light emitting device being 110 nm or less, and a second scattering index B/A of an effective radiance B to a radiance A, as defined by the following formula (2), being 0.060 or less, wherein A is the radiance of light emitted by the light emitting device in a range of 300 nm or more and 800 nm or less, and B is the effective radiance of light emitted by the light emitting device in a range of 300 nm or more and 800 nm or less in consideration of a scattering intensity curve for wavelengths when the scattering intensity of Rayleigh scattering at a wavelength of 300 nm is 1:

$$B/A = \frac{\int_{300}^{800} Dc(\lambda) \times S(\lambda) d\lambda}{\int_{300}^{800} S(\lambda) d\lambda} \tag{2}$$

wherein $S(\lambda)$ represents a spectral radiance of light emitted by the light emitting device and $Dc(\lambda)$ represents a scattering intensity curve for wavelengths when the scattering intensity of Rayleigh scattering at a wavelength of 300 nm is 1 in Rayleigh scattering.

13. The light emitting device according to claim 12, wherein the first fluorescent material has a full width at half maximum of a light emission peak having a light emission peak wavelength in a light emission spectrum of the first fluorescent material within a range of 3 nm or more and 120 nm or less.

14. The light emitting device according to claim 12, wherein the first fluorescent material comprises at least one selected from the group consisting of a first nitride fluorescent material having a composition represented by the following formula (1A), a second nitride fluorescent material having a composition represented by the following formula (1B), a fluoride fluorescent material having a composition represented by the following formula (1C), and a fluoride fluorescent material having a composition represented by the following formula (1C') that is different from that of the following formula (1C):

$$M^1_2Si_5N_8:Eu \quad (1A)$$

wherein $M^1$ represents an alkaline earth metal element containing at least one selected from the group consisting of Ca, Sr, and Ba;

$$Sr_qCa_sAl_tSi_uN_v:Eu \quad (1B)$$

wherein q, s, t, u, and v each satisfy $0 \leq q < 1$, $0 < s \leq 1$, $q+s \leq 1$, $0.9 \leq t \leq 1.1$, $0.9 \leq u \leq 1.1$, and $2.5 \leq v \leq 3.5$;

$$A_c[M^2_{1-b}Mn^{4+}_bF_d] \quad (1C)$$

wherein A includes at least one selected from the group consisting of $K^+$, $Li^+$, $Na^+$, $Rb^+$, $Cs^+$, and $NH_4^+$, $M^2$ includes at least one element selected from the group consisting of Group 4 elements and Group 14 elements, b satisfies $0 < b < 0.2$, c represents the absolute value of the charge of $[M^2_{1-b}Mn^{4+}_bF_d]$ ions, and d satisfies $5 < d < 7$; and $$A'_{c'}[M^{2'}_{1-b'}Mn^{4+}_{b'}F_{d'}] \quad (1C')$$

wherein A' includes at least one selected from the group consisting of $K^+$, $Li^+$, $Na^+$, $Rb^+$, $Cs^+$, and $NH_4^+$, $M^{2'}$ includes at least one element selected from the group consisting of Group 4 elements, Group 13 elements, and Group 14 elements, b' satisfies $0 < b' < 0.2$, c' represents the absolute value of the charge of $[M^{2'}_{1-b'}Mn^{4+}_{b'}F_{d'}]$ ions, and d' satisfies $5 < d' < 7$.

15. The light emitting device according to claim 12, comprising a second fluorescent material having a light emission peak wavelength in a range of 480 nm or more and 570 nm or less.

16. The light emitting device according to claim 15, wherein the second fluorescent material has a full width at half maximum of a light emission peak having a light emission peak wavelength in a light emission spectrum of the second fluorescent material within a range of 20 nm or more and 125 nm or less.

17. The light emitting device according to claim 15, wherein the second fluorescent material comprises at least one selected from the group consisting of a rare earth aluminate fluorescent material having a composition represented by the following formula (2A) and a third nitride fluorescent material having a composition represented by the following formula (2B):

$$Ln^1_3(Al_{1-a}Ga_a)_5O_{12}:Ce \quad (2A)$$

wherein $Ln^1$ includes at least one element selected from the group consisting of Y, Gd, Tb, and Lu, and a satisfies $0 \leq a \leq 0.5$; and $$La_wLn^2_xSi_6N_y:Ce_z \quad (2B)$$

wherein $Ln^2$ includes at least one selected from the group consisting of Y and Gd as an essential component, and may include at least one selected from the group consisting of Sc and Lu, the total of Y and Gd contained in $Ln^2$ is 90 mol % or more when the $Ln^2$ elements contained in 1 mol of the composition is 100 mol %, and w, x, y, and z each satisfy $1.2 \leq w \leq 2.2$, $0.5 \leq x \leq 1.2$, $10 \leq y \leq 12$, $0.5 \leq z \leq 1.2$, $1.80 < w+x < 2.40$, and $2.9 \leq w+x+z \leq 3.1$.

18. The light emitting device according to claim 15, wherein a content of the first fluorescent material relative to a total amount of the first fluorescent material and the second fluorescent material is in a range of 5% by mass or more and 95% by mass or less.

19. The light emitting device according to claim 12, emitting light having a color deviation Duv from a black body radiation locus within a range of minus (−) 0.008 or more and plus (+) 0.008 or less.

20. The light emitting device according to claim 12, emitting light having a second radiance in a range of 650 nm or more and 750 nm or less being 50% or less relative to 100% of a first radiance in a range of 400 nm or more and 750 nm or less.

* * * * *